(12) United States Patent
Meyer et al.

(10) Patent No.: US 9,574,825 B2
(45) Date of Patent: Feb. 21, 2017

(54) DIRECTIONAL SOLIDIFICATION FURNACE HAVING MOVABLE HEAT EXCHANGERS

(75) Inventors: Benjamin Michael Meyer, Defiance, MO (US); Lee William Ferry, St. Charles, MO (US)

(73) Assignee: MEMC Singapore Pte. Ltd., Singapore (SG)

( * ) Notice: Subject to any disclaimer, the term of this patent is extended or adjusted under 35 U.S.C. 154(b) by 214 days.

(21) Appl. No.: 13/613,472

(22) Filed: Sep. 13, 2012

(65) Prior Publication Data
US 2013/0239616 A1 Sep. 19, 2013

Related U.S. Application Data

(60) Provisional application No. 61/534,568, filed on Sep. 14, 2011.

(51) Int. Cl.
| | | |
|---|---|---|
| *C03B 5/027* | (2006.01) | |
| *C30B 11/00* | (2006.01) | |
| *F27D 9/00* | (2006.01) | |
| *C30B 28/06* | (2006.01) | |
| *C01B 33/021* | (2006.01) | |

(Continued)

(52) U.S. Cl.
CPC .............. *F27D 9/00* (2013.01); *C01B 33/021* (2013.01); *C30B 11/002* (2013.01); *C30B 11/003* (2013.01); *C30B 11/006* (2013.01); *C30B 28/06* (2013.01); *F27B 14/20* (2013.01); *C30B 29/06* (2013.01)

(58) Field of Classification Search
CPC ....... C01B 33/021; C01B 33/02; F27B 14/20; F27B 14/04; F27B 14/14; F27B 14/08; F27B 17/0075; F27D 9/00; C03B 11/002; C03B 11/003; C03B 11/006; C30B 28/06; C30B 29/06

USPC ........ 373/112, 113, 118, 129, 137, 140, 154, 373/153, 128, 27, 30, 130, 136, 155, 75, 373/76, 71, 165; 219/385, 638, 476, 477; 117/202, 206, 74, 83, 200, 204, 223, 18, 117/214, 216; 65/33.9, 355, 137, 90, 65/19.19, 29.19, 162; 423/349; 422/245.1, 109; 126/343.5 R, 198

See application file for complete search history.

(56) References Cited

U.S. PATENT DOCUMENTS 3,836,325 A * 9/1974 Nakamura et al. ........... 219/654
5,543,890 A * 8/1996 Tanaka et al. ................. 355/53

(Continued)

FOREIGN PATENT DOCUMENTS

| CN | 101089233 A | 12/2007 |
| CN | 201962406 U | 9/2011 |

(Continued)

OTHER PUBLICATIONS

PCT International Search Report of the International Searching Authority mailed on Dec. 19, 2012 regarding PCT/US2012/055177 filed on Sep. 13, 2012; 11 pgs.

*Primary Examiner* — Hung D Nguyen
(74) *Attorney, Agent, or Firm* — Armstrong Teasdale LLP

(57) ABSTRACT

A directional solidification furnace includes one or more movable cooling plates disposed beneath a crucible. In a first position, the cooling plates are free from contact with a crucible support positioned adjacent the crucible. In a second position, the cooling plates are in contact with the crucible support. A control system is used to control the amount of force exerted by the cooling plates against the crucible.

14 Claims, 29 Drawing Sheets

(51) Int. Cl.
*F27B 14/20* (2006.01)
*C30B 29/06* (2006.01)

(56) References Cited

U.S. PATENT DOCUMENTS

| | | |
|---|---|---|
| 2007/0227189 A1 | 10/2007 | Sakai |
| 2007/0283882 A1* | 12/2007 | Cho et al. .................... 117/204 |
| 2009/0013925 A1* | 1/2009 | Servant et al. ............... 117/206 |
| 2009/0090296 A1* | 4/2009 | Gil ....................... C30B 11/002 373/140 |
| 2011/0220012 A1 | 9/2011 | Wu et al. |
| 2011/0259316 A1 | 10/2011 | Pelletier et al. |

FOREIGN PATENT DOCUMENTS

| | | |
|---|---|---|
| DE | 102009022412 A1 | 11/2010 |
| EP | 2014803 A1 | 1/2009 |
| WO | 2010005705 A1 | 1/2010 |
| WO | 2010024541 A2 | 3/2010 |
| WO | 2010069784 A1 | 6/2010 |

* cited by examiner

DIRECTIONAL SOLIDIFICATION FURNACE HAVING MOVABLE HEAT EXCHANGERS

CROSS-REFERENCE TO RELATED APPLICATIONS

This application claims priority to U.S. Provisional Patent Application No. 61/534,568 filed on Sep. 14, 2011, the entire disclosure of which is hereby incorporated by reference in its entirety.

FIELD

This disclosure relates generally to multi-crystalline silicon ingots and, more specifically, to aspects of a directional solidification furnace used in the production of multi-crystalline silicon ingots.

BACKGROUND

Directional solidification furnaces are used, for example, to produce multi-crystalline silicon ingots. These furnaces have a crucible into which raw poly-crystalline silicon is placed. The crucible is supported by a structure that adds structural rigidity to the crucible. The crucible is disposed within a containment vessel that forms part of the furnace and seals the crucible from the ambient environment.

During use, the raw silicon is melted and then cooled at a controlled rate to achieve directional solidification within the resulting ingot. The controlled rate of cooling is established by any combination of reducing the amount of heat applied by the heaters, movement of or opening of insulation surrounding the crucible, and/or the circulation of a cooling medium through a heat exchanger disposed adjacent the crucible and/or the crucible support. The ingot solidifies in the region closest to the cooler side of the crucible and proceeds in a direction away from the cooler side of the crucible.

The size of silicon ingots produced in these furnaces has been increasing in order to improve efficiency and reduce the cost required to produce the ingots. However, previous attempts to increase the mass of the silicon ingots over about 600 kg have proved unsuccessful for a variety of reasons. There exists a need for a silicon ingot having greater mass (e.g., greater than about 600 kg) and furnaces capable of producing these larger ingots.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

A first aspect is directed to a directional solidification furnace for producing a multi-crystalline silicon ingot. The furnace comprises a crucible for containing a silicon charge, a crucible support disposed adjacent the crucible for supporting the crucible, the crucible support having a base, a cooling plate positioned beneath the base of the crucible support, a lift system for moving the cooling plate between a first position where the plate is free from contact with the base of the crucible support and a second position where the plate is in contact with the base of the crucible support, and a control system to control the amount of force exerted by the cooling plate on the base of the crucible support.

In another aspect, a system for raising and lowering one or more cooling plates in a directional solidification furnace for producing a multi-crystalline silicon ingot, the furnace including a crucible for containing a silicon charge and a support disposed adjacent the crucible is disclosed. The system comprises one or more cooling plates positioned beneath a base of the support, a lift system for moving the cooling plates between a first position where the plates are free from contact with the base of the crucible support and a second position where the plates are in contact with the base of the crucible support, and a control system to control the amount of force exerted by at least one of the cooling plates on the base of the crucible support.

In yet another aspect, a method for producing a multi-crystalline silicon ingot in a directional solidification furnace is disclosed. The method comprises charging a crucible in the furnace with poly-crystalline silicon, the crucible being supported by a crucible support, melting the poly-crystalline silicon, moving one or more cooling plates disposed beneath a base of the crucible support from a first position where the plates are free from contact with the base of the support to a second position where the plates are in contact with the base of the support, where the one or more cooling plates are moved with a lift system, controlling, with a control system, the amount of force exerted by at least one of the cooling plates on the base of the crucible support, and cooling the molten silicon to form a multi-crystalline silicon ingot.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
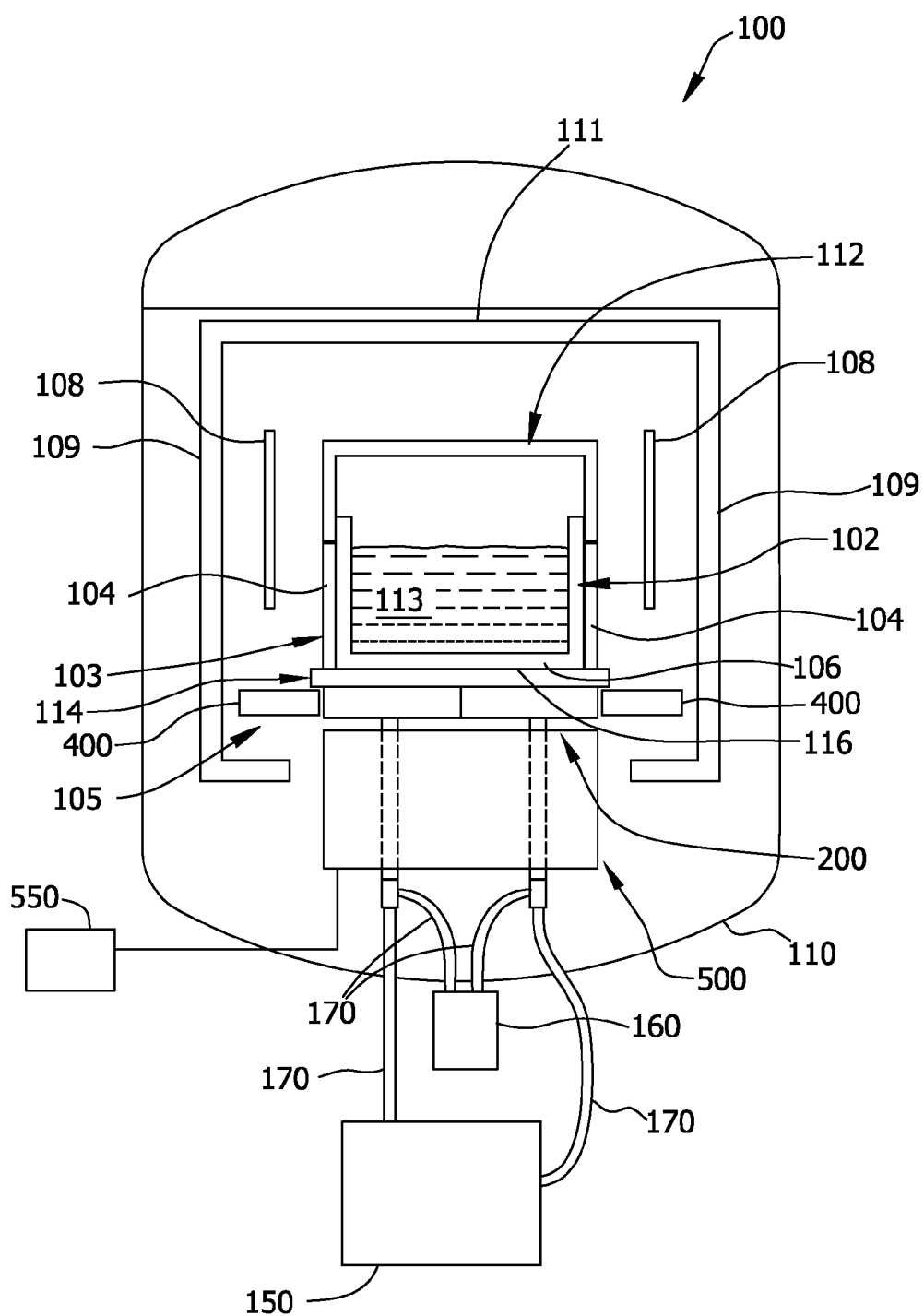
FIG. 1 is a schematic cross-sectional view of an example directional solidification furnace and heat exchangers.

Referring to the drawings, an exemplary directional solidification furnace is shown in FIG. 1 and indicated generally at 100. The furnace 100 is of the type used to melt poly-crystalline silicon and produce a multi-crystalline silicon ingot. Such an ingot may be used to manufacture photovoltaic devices, among other possible uses. The furnace 100 is operable to produce silicon ingots having a mass greater than about 1000 kg.

The directional solidification furnace 100 of FIG. 1 comprises a crucible 102 having a base 106. The crucible 102 and the base 106 are supported by a crucible support 103 having support walls 104 that add structural rigidity to the crucible. The crucible 102 is typically constructed of quartz, or another suitable material that can withstand high temperatures while remaining essentially inert. The crucible 102 is surrounded by a containment vessel 110. Side insulation 109 is disposed around the crucible and may optionally be movable away from the crucible. In the example embodiment, upper insulation 111 is positioned vertically above the side insulation 109.

Together with a lid 112, the crucible 102 and crucible support 103 form an inner assembly 105 of the furnace 100. In other embodiments, the furnace 100 may not include a lid. Heaters 108 are positioned around the walls 104 and within the containment vessel 110. The heaters 108 may suitably be radiant heaters configured to apply the heat necessary to melt charge material within the crucible into a melt. The charge material of this embodiment is silicon, though other materials are contemplated.

A bottom 114 of the crucible support 103 may be positioned on support posts 115 (FIGS. 6 and 7), broadly "supports" or "support structure", in some embodiments. A heat exchanger, indicated generally at 200 and discussed in greater detail below, is positioned adjacent the bottom 114 of the crucible support 103 and proximate a lower surface 116 of the base 106 of the crucible 102. Lower insulating members 400 and a cooling plate lift system 500 are shown schematically in FIG. 1 and are described in greater detail below.

Figure 8:
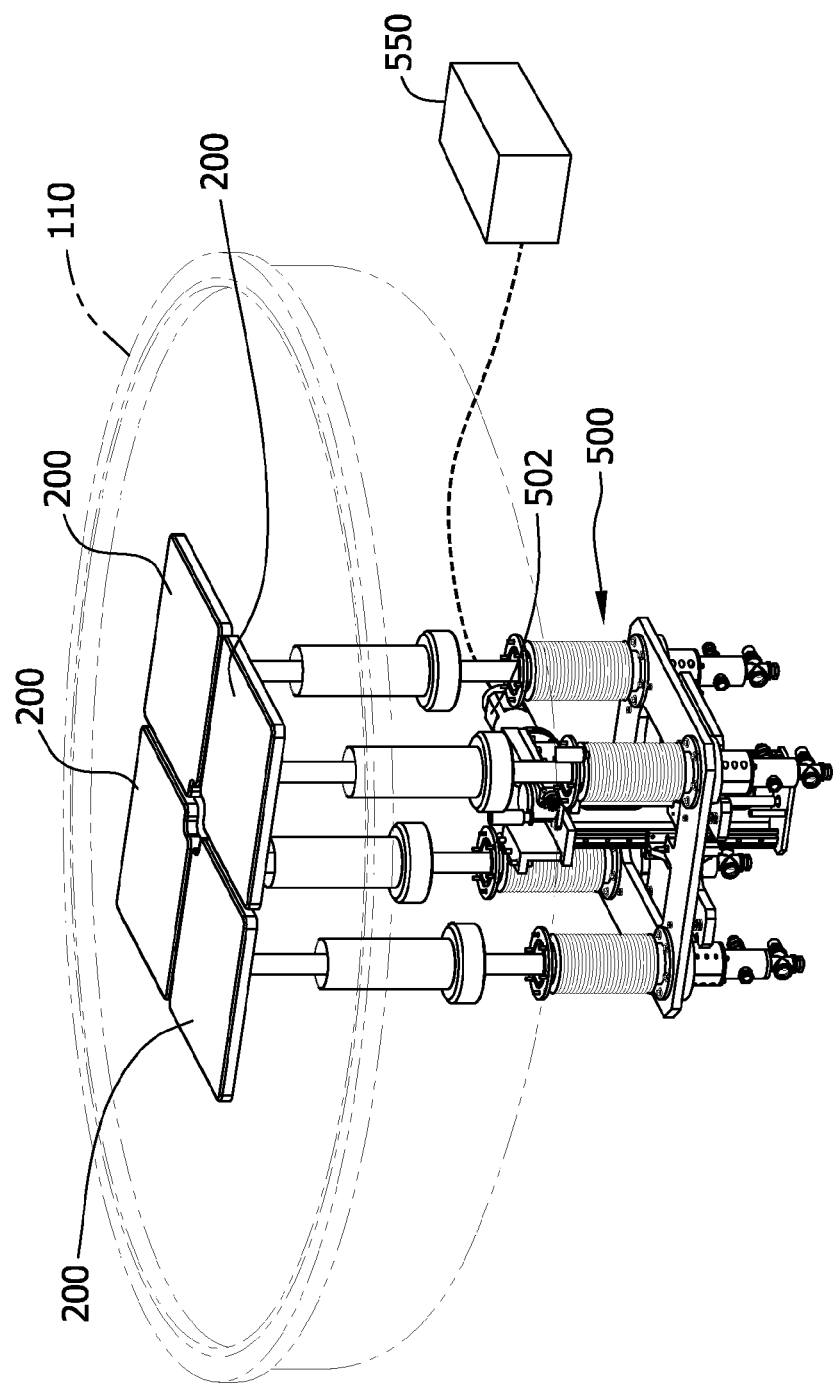
FIG. 8 is a perspective view of four heat exchangers for use in the furnace of FIG. 1 and a lift mechanism to move the heat.

Two heat exchangers 200 (broadly, cooling plates) are shown in the cross-sectional schematic of FIG. 1, and two additional similarly sized and configured heat exchangers are omitted in FIG. 1, but shown in FIG. 8. Any number of heat exchangers 200 may be used without departing from the scope of the embodiments. The heat exchangers 200 are discussed in greater detail below in relation to FIGS. 17-27.

The heat exchanger 200 is used to transfer heat from the crucible 102 (and the melt contained therein) to a liquid coolant flowing through the heat exchanger. The heat exchanger 200 is supplied with "fresh" coolant from a source tank (indicated schematically at 150 in FIG. 1). After flowing through the heat exchanger 200 the coolant is referred to as "spent" coolant and flows to a receiving tank (indicated schematically at 160 in FIG. 1). The spent coolant may then be cooled (e.g., by a refrigeration or heat dissipation system) and flow back to the source tank 150. The refreshed coolant can then flow again through the heat exchanger (i.e., be recycled). In other embodiments, the spent coolant may be disposed of and not reused after flowing to the receiving tank.

Figure 2:
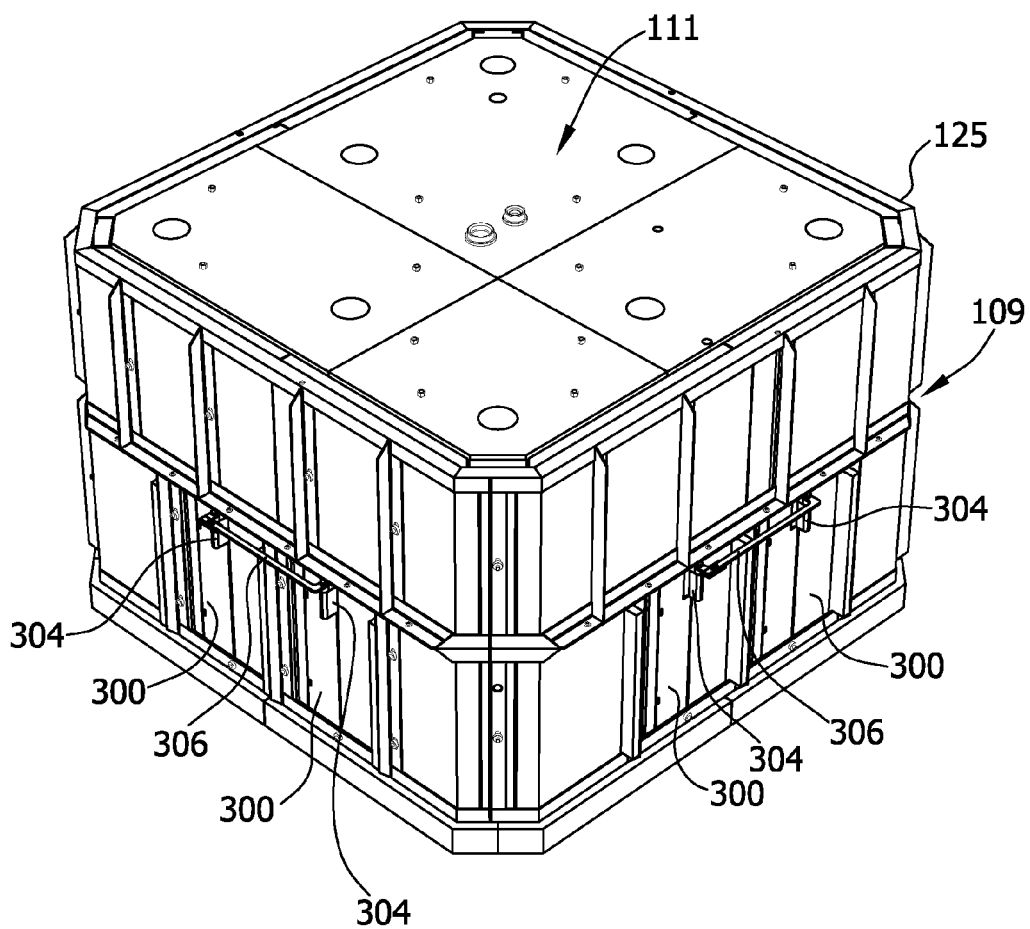
FIG. 2 is a perspective view of an example insulation system for use in the furnace of FIG. 1 with doors in a first position.
Figure 3:
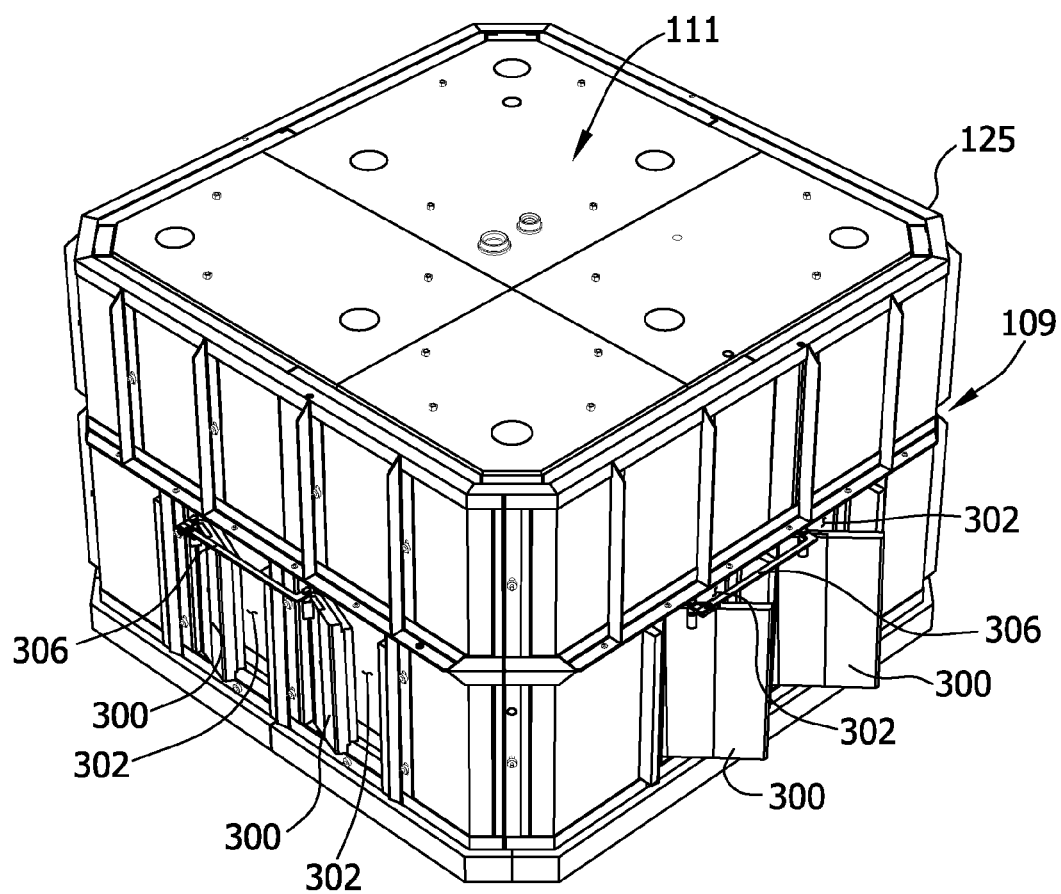
FIG. 3 is a perspective view of the insulation system of FIG. 2 with the doors in the second position.
Figure 4:
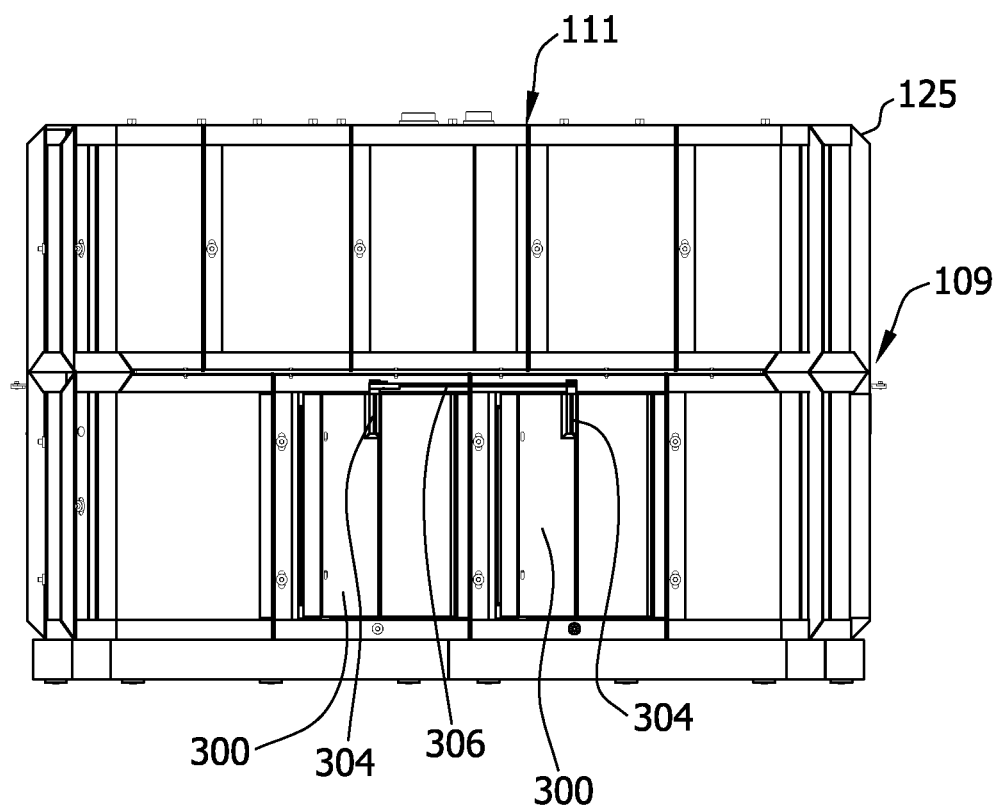
FIG. 4 is a front view of the insulation system of FIG. 2.

With reference to FIGS. 2-4, doors 300 (also referred to as louvers) are formed in the side insulation 109 surrounding the crucible 102. In FIGS. 2-4, only the side insulation 109, upper insulation 111, and supporting structure 125 are shown and the other components of the furnace 100 are omitted for clarity. Moreover, the doors 300 are omitted in FIG. 1 for clarity.

Each door 300 is sized to fit within a corresponding opening 302 (best seen in FIG. 3) formed in the side insulation 109. There are two doors 300 formed in each section of the side insulation 109 in the example embodiment, although other embodiments may use different numbers of doors. Moreover, other embodiments may use doors positioned differently in the side insulation 109 and/or doors positioned in the upper insulation 111. For example, in other embodiments doors may be configured to rotate about a horizontal axis, rather than a vertical axis. Moreover, doors may be formed in a shape similar to slats or window blinds.

The doors 300 are connected to the side insulation 109 by hinges 304 disposed at longitudinal edges of the doors. The hinges 304 are in turn connected to the supporting structure 125. In other embodiments, a rod (not shown) or other similar structure is connected to the doors 300 generally adjacent a centerline of the doors. Opposing ends of the rod are connected to the side insulation 109 adjacent the openings 302 and/or the supporting structure. The doors 300 in this embodiment are rotated about an axis parallel to the rod when opening or closing the doors.

The doors 300 are also connected to suitable actuators (not shown) that are operable to open and close the doors. In the example embodiment, two adjacent doors 300 are connected together by a linkage 306 such that the adjacent doors operate in unison and a single actuator is operable to operate both of the doors.

In a closed position (i.e., a first position) as seen in FIGS. 2 and 4, the doors 300 substantially restrict the flow of heat through the openings 302 formed in the side insulation 109. Gaskets, lap-joints, or other structures (not shown) positioned at the edges of the doors 300 and/or openings 302 may be used to further restrict the flow of heat through any void that remains between the doors and the opening when the doors are closed.

In an open position (i.e., a second position) shown in FIG. 3, the doors 300 permit heat to flow through the exposed openings 302 in the side insulation 109. According to some embodiments, the rotational position of the doors 300 may be adjusted to control the flow of heat through the side insulation 109. For example, the doors 300 can be fully opened such that the doors are perpendicular to the side insulation 109 in order to permit more heat to pass through the openings 302.

The doors 300 may alternatively be rotated such that they are disposed at an angle less than 90 degrees to decrease the amount of heat that can pass through the openings 302. Such a position of the doors is referred to as an intermediate position. A control system (such as the controller 550 shown in FIGS. 1 and 8) may be used to adjust the position of the doors 300 in the intermediate position to regulate the rate of heat transfer from the melt.

Figure 5:
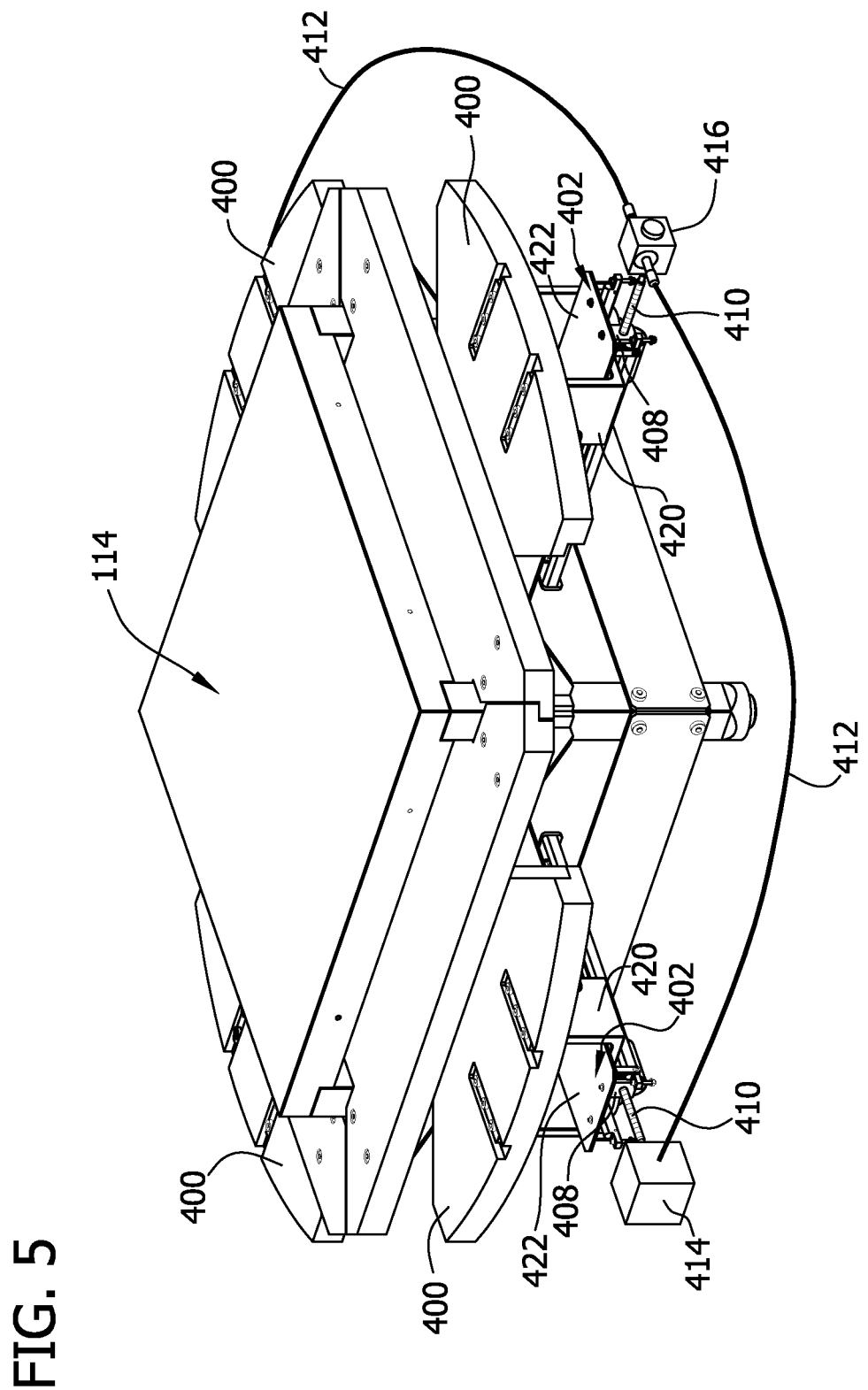
FIG. 5 is a perspective view of lower insulating members in a second position for use with the furnace of FIG. 1.
Figure 6:
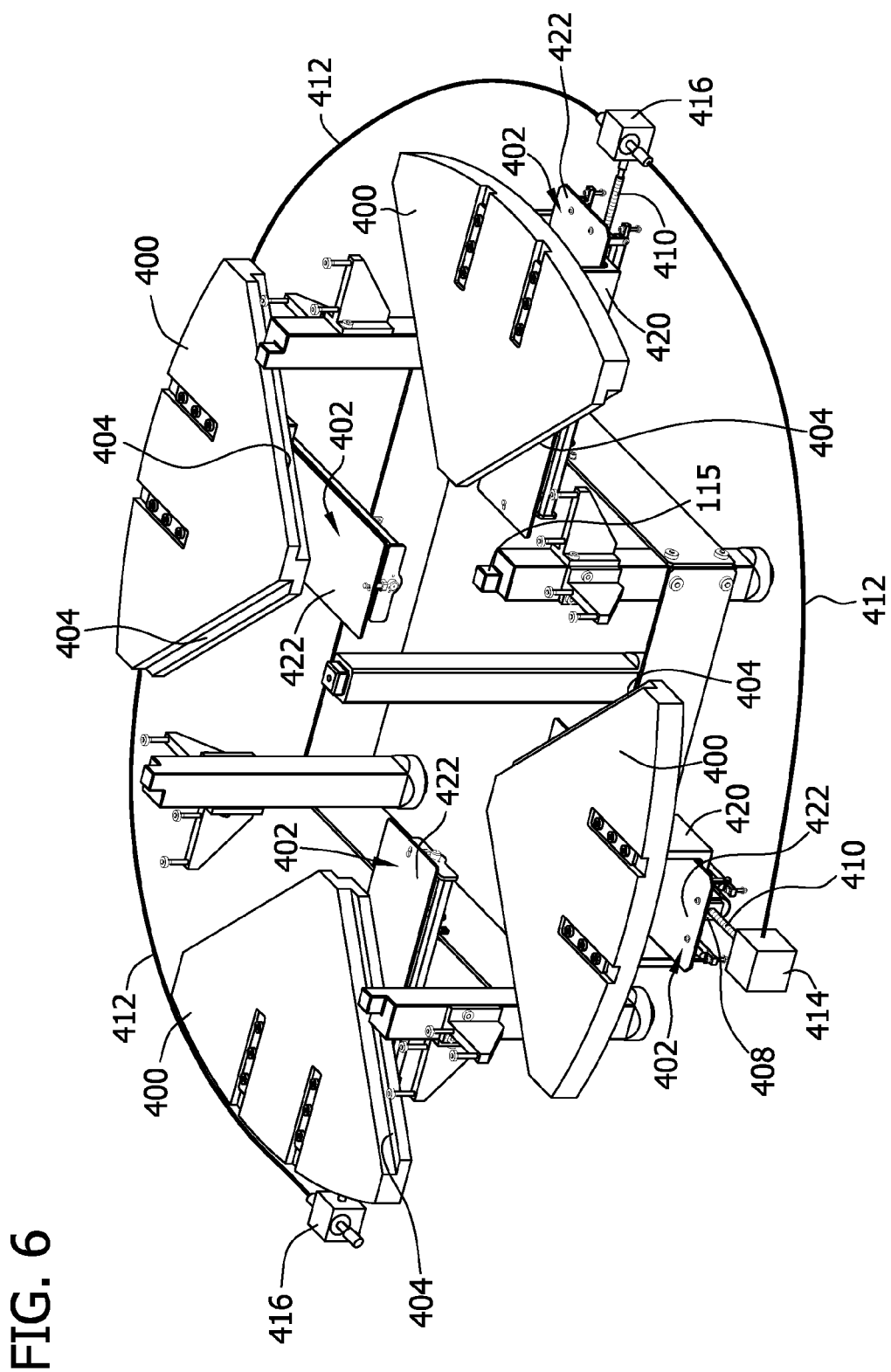
FIG. 6 is a perspective view of the lower insulating members of FIG. 5 with the crucible support and other structures removed for clarity.
Figure 7:
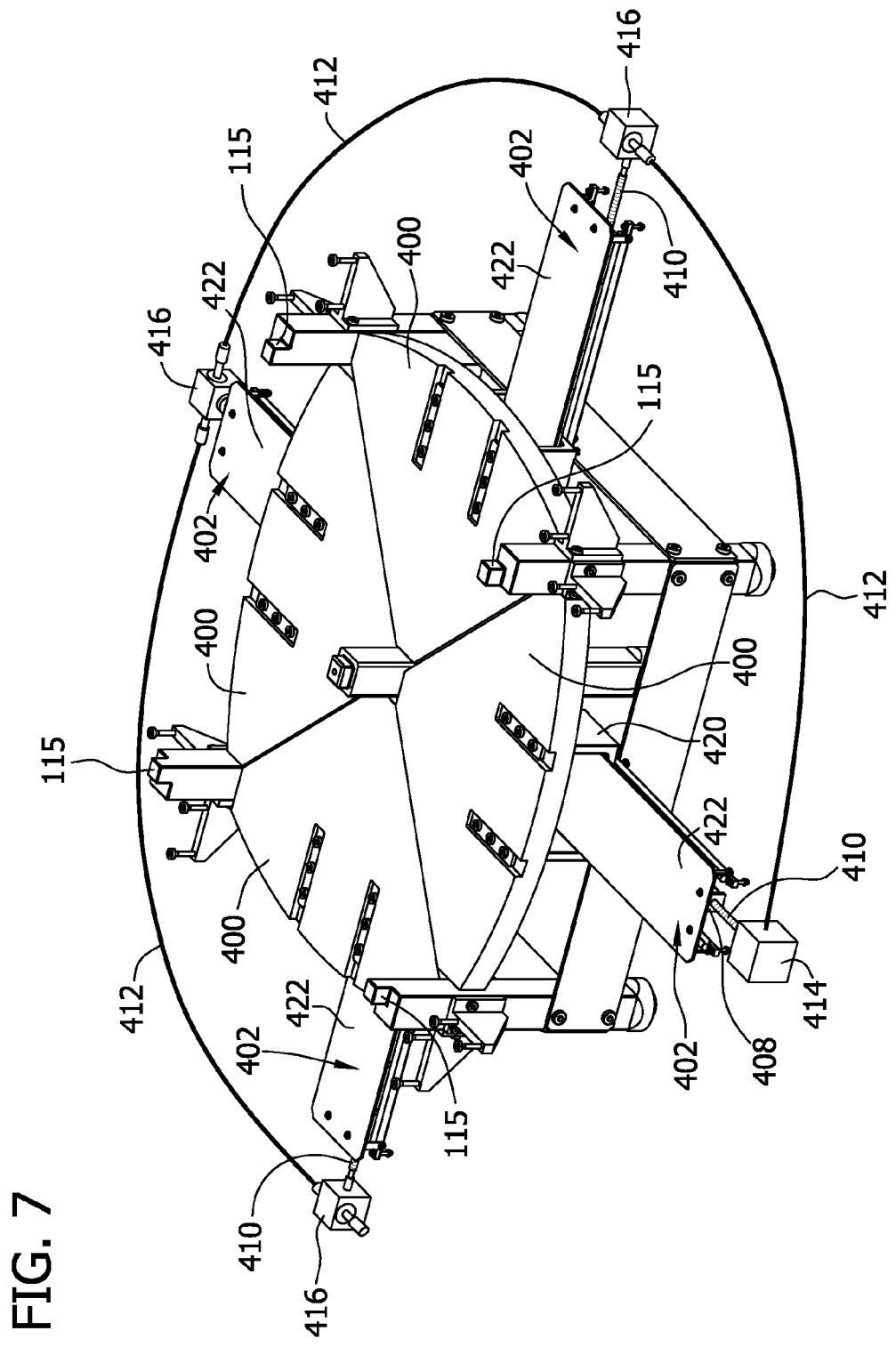
FIG. 7 is a perspective view of the lower insulating members of FIG. 6 in a first position.

FIGS. 5-7 depict lower insulating members 400 disposed between the heat exchanger 200 (FIG. 1) and the bottom 114 of the crucible support 103. Other components of the furnace 100 have been omitted from FIGS. 5-7 for clarity. Further, the bottom 114 of the crucible support 103 is omitted from FIGS. 6 and 7.

The lower insulating members 400 are laterally movable between a closed position (i.e., a first position) where they are disposed beneath the bottom 114 of the crucible support 103 (FIG. 7) and an open positioned (i.e., a second position) where the members are disposed laterally outward and are not beneath the bottom of the crucible support (FIGS. 1, 5 and 6). In the first position where the insulating members 400 are disposed beneath the crucible support 103, the members substantially restrict the flow of heat into the heat exchanger 200 from the lower surface 116 of the base 106 of the crucible 102 and the bottom 114 of the crucible support 103. In the second position, the members 400 permit heat to flow through the lower surface 116 of the base 106 of the crucible 102 and the bottom 114 of the crucible support 103 into the heat exchangers 200. Further, the second position permits upward movement of the heat exchangers 200.

While reference is made herein to positioning the members 400 in either the first position or the second position, they may instead be positioned in between these two positions during operation of the furnace 100. For example, the members 400 may be positioned in an intermediate position to control the flow of heat from the melt in the crucible 102 through the crucible support 103. In this intermediate position the members 400 restrict the flow of heat away from the crucible support 103 to a lesser extent than when in the first position. A control system (such as the controller 550 shown in FIGS. 1 and 8) may be used to adjust the position of the members 400 in the intermediate position to regulate the rate of heat transfer from the melt through the crucible 102 and crucible support 103, and into the heat exchangers 200. Moreover, the intermediate position includes any position of the members 400 which is between the first position and the second position.

In the example embodiment, four insulating members 400 are provided and each has the shape of a quadrant of a circle or square. Accordingly, when in the first position the insulating members 400 have a generally circular or square shape and have a substantially contiguous surface. Other embodiments may use more or less members and/or different shaped members 400 without departing from the scope of the embodiments. This configuration of the four insulating members 400 in the example embodiment results in a relatively uniform rate of heat removal across the crucible support 103 when the members 400 are in an intermediate position. This relatively uniform rate is at least partially the result of the "X-shaped" symmetric opening formed between the edges 404 of the members when in an intermediate position. Contrastingly, if fewer insulating members (e.g., one or two) were used, such an "X-shaped" symmetric opening would not be formed between the members. The resulting asymmetric opening would result in an asymmetrical rate of heat removal across the crucible support 103 when the members are in an intermediate position.

In other embodiments, insulating members may be slats similar to window blinds that are configured to rotate between positions instead of moving laterally. These insulating members may be rotated to various positions to control the flow of heat therethrough.

As best seen in FIG. 6, edges 404 of each member 400 have an overlapping or "ship-lapped" configuration. When the members 400 are in the first position a portion of the edge 404 of one member overlaps a portion of the edge of an adjacent member. The overlapping configuration of the edges 404 reduces minimizes radiative heat transfer by reducing or eliminating the view factor of the heat exchanger 200 when the members 400 are in the first position. Moreover, any molten material which might spill from the crucible 102 would have to travel a more circuitous path to reach the heat exchangers 200. This spilled material would thus be less likely to contact and possibly damage the heat exchangers 200.

The lower insulating members 400 are each connected to an actuating system 402 that is operable to move the insulating members 400 between the first position and the second position. In the example embodiment, the actuating system 402 for each insulating member 400 comprises a nut 408 connected to a drive (broadly, power) screw 410. The nuts 408 and corresponding drive screws 410 may have acme threads in some embodiments. The nuts 408 are in turn connected to carriages 420 onto which the insulating members 400 are mounted. In other embodiments, the nuts 408 and corresponding drive screws 410 may be ball screw systems and/or other types of actuators may be used. A radiation shield 422 is positioned vertically about the nuts 408 and screws 410 to shield the nuts and screws from radiative heat.

Each of the drive screws 410 is in turn connected to a single flexible drive shaft 412 by any suitable power transmission system (e.g., one or more gears). This drive shaft 412 is rotated by a suitable rotary actuator 414. In the example embodiment, the power transmission system is a gearbox 416.

Rotation of the drive shaft 412 results in rotation of each drive screw 410 and linear motion of each nut 408. Linear motion of the nuts 408 results in corresponding linear motion of the insulating members 400 connected to each nut. This arrangement of a single rotary actuator 414 used to move each of the insulating members 400 ensures that the members move generally in unison. Other embodiments may use different systems of actuators or other mechanisms to move the members 400 between positions without departing from the scope of the embodiments. For example, each respective member 400 may be connected to a single actuator that is configured to move only the respective member between the positions. These single actuators may be connected to a suitable control system (such as the controller 550 shown in FIGS. 1 and 8) that is operable to control their movement so that the actuators move in unison. Other embodiments may use a control system that permits the members 400 to be moved independently of each other.

FIGS. 8-16 depict a heat exchanger lift system 500 (broadly, a lift system). In the example embodiment, this lift system 500 is used in conjunction with the lower insulating members 400 and/or doors 300 described above. In other embodiments, the lift system 500 may be used in furnaces 100 that do not use movable lower insulating members 400 and/or doors 300.

Figure 9:
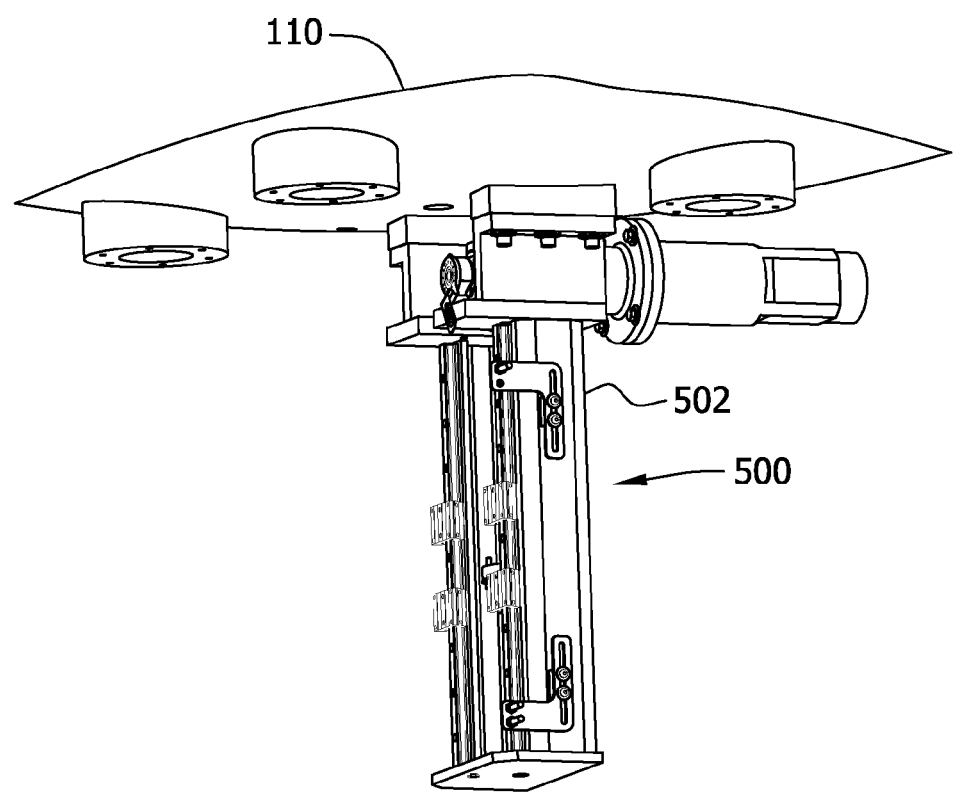
FIGS. 9-16 depict the lift mechanism of FIG. 8 in various stages of assembly.

In FIGS. 8 and 9, a lower portion of the containment vessel 110 is shown and other components of the furnace 100 are omitted. In FIGS. 9-16, various components of the lift system 500 are shown in greater detail.

The lift system 500 is operable to move the heat exchangers 200 between a first position and a second position. In the first position, the heat exchangers 200 are spaced apart from the bottom 114 of the crucible support 103 by a sufficient gap such that the lower insulating members 400 can be disposed in their first position. Thus, the heat exchangers 200 are free from contact with the crucible support 103 in the first position. In the second position, the heat exchangers 200 are in contact with the bottom 114 of the crucible support 103. When the heat exchangers 200 are in their second position, the lower insulating members 400 are in their second position as well. In the example embodiment, the heat exchangers 200 move between about ten inches to twenty inches when travelling between the first position and the second position, although they may travel greater or lesser distances without departing from the scope of the embodiments.

Figure 10:
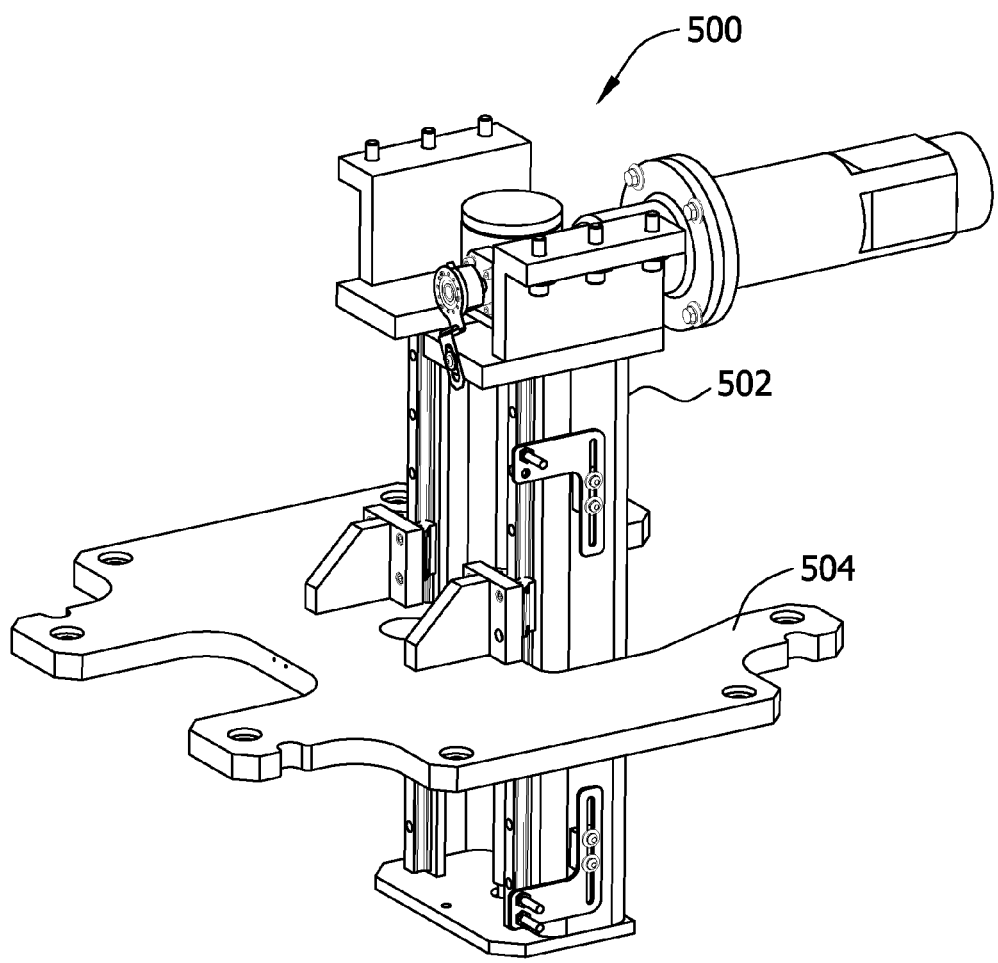
Figure 11:
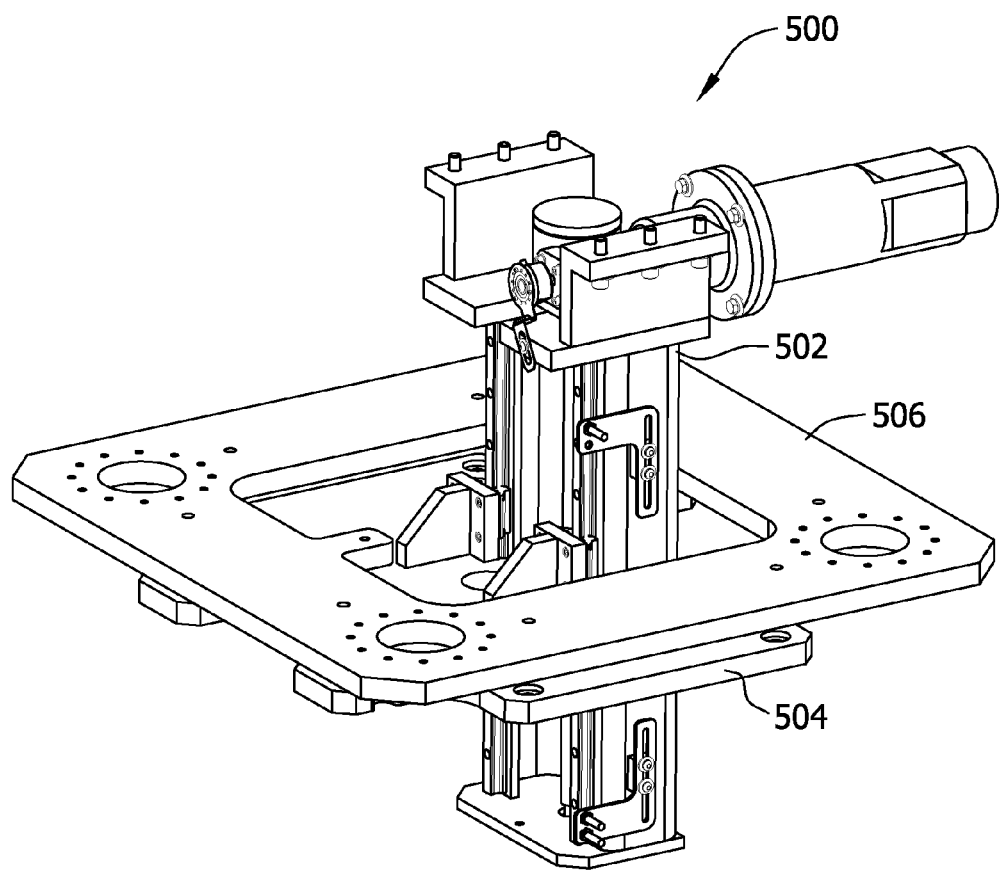
Figure 12:
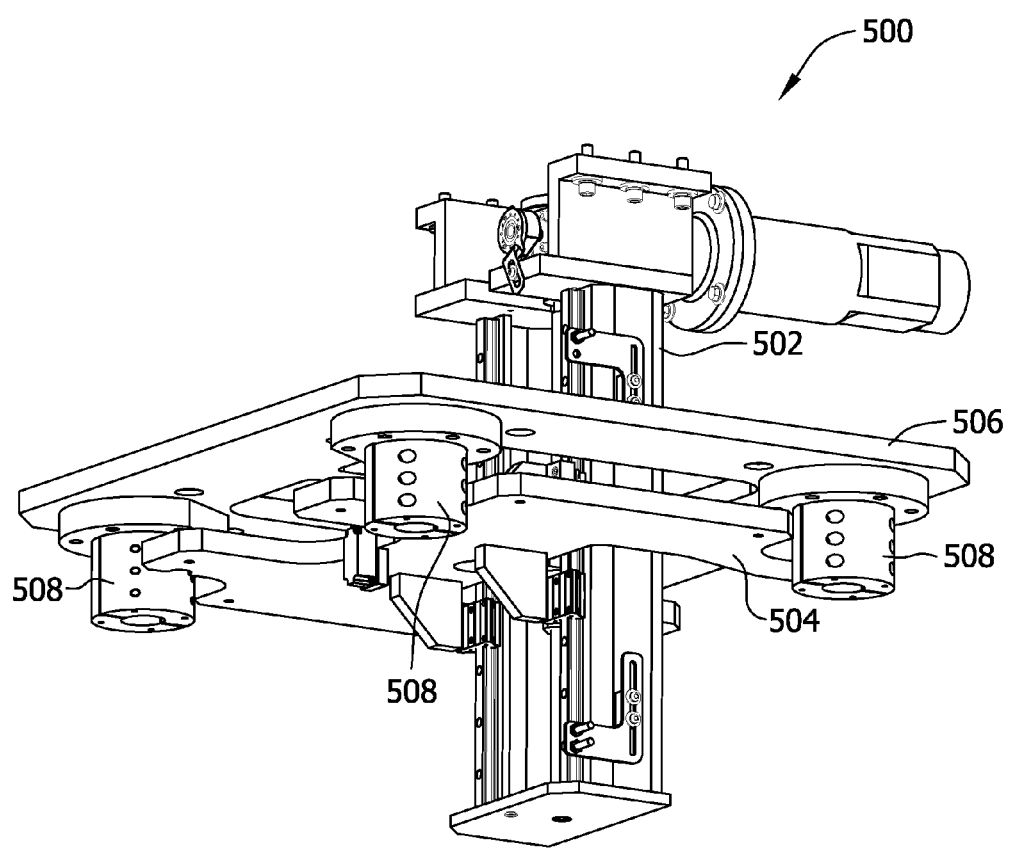
Figure 13:
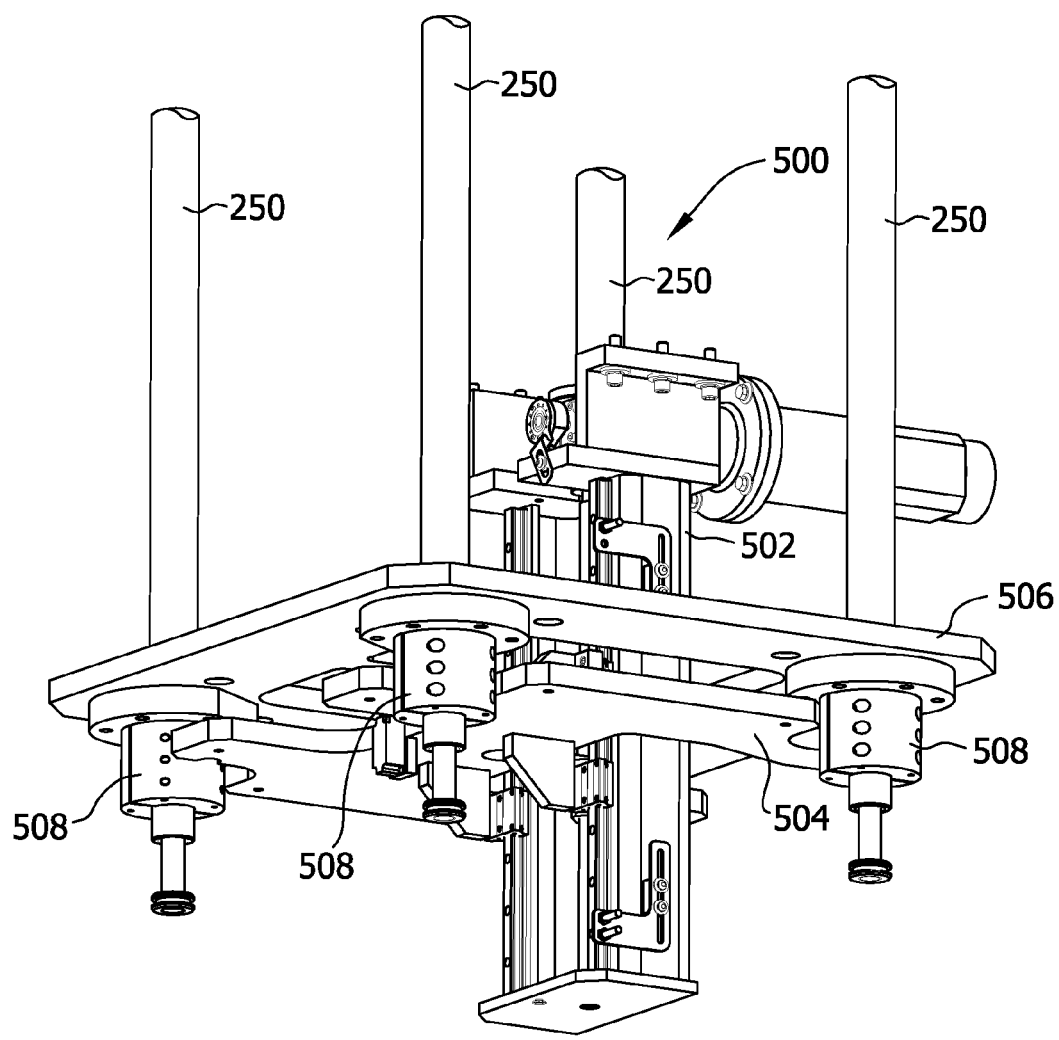

The heat exchangers 200 are movable between their first position and second position by an actuator 502, as shown in FIGS. 9 and 10. The actuator 502 is connected at one end to a lower plate 504 (FIG. 10) and at another, opposing to the containment vessel 110 (FIG. 9). An upper plate 506 is connected to the lower plate 504 and springs 512 (FIG. 14) are positioned between the two plates. Four collar clamps 508 are connected to the upper plate 506, as shown in FIG. 12. The collar clamps 508 are operable to connect a conduit 250 of the heat exchangers 200 to the lift system 500 as best seen in FIG. 13. Bellows 510 (FIG. 14) surround portions of these conduits 250 and are connected at one end to the upper plate 506 and at the other, opposing end to containment vessel 110.

In the example embodiment, the actuator 502 (broadly, an actuating system) is a linear actuator that is operable to exert sufficient force on the heat exchanger 200 to press the heat exchanger against the bottom 114 of the crucible support 103 when in the second position. In another embodiment, the actuator 502 is a rotary actuator that is connected to a pinion gear. This pinion gear is in registry with a gear rack such that rotation of the pinion gear results in linear displacement of the gear rack. Other types of suitable actuators may be used without departing from the scope of the embodiments.

Figure 14:
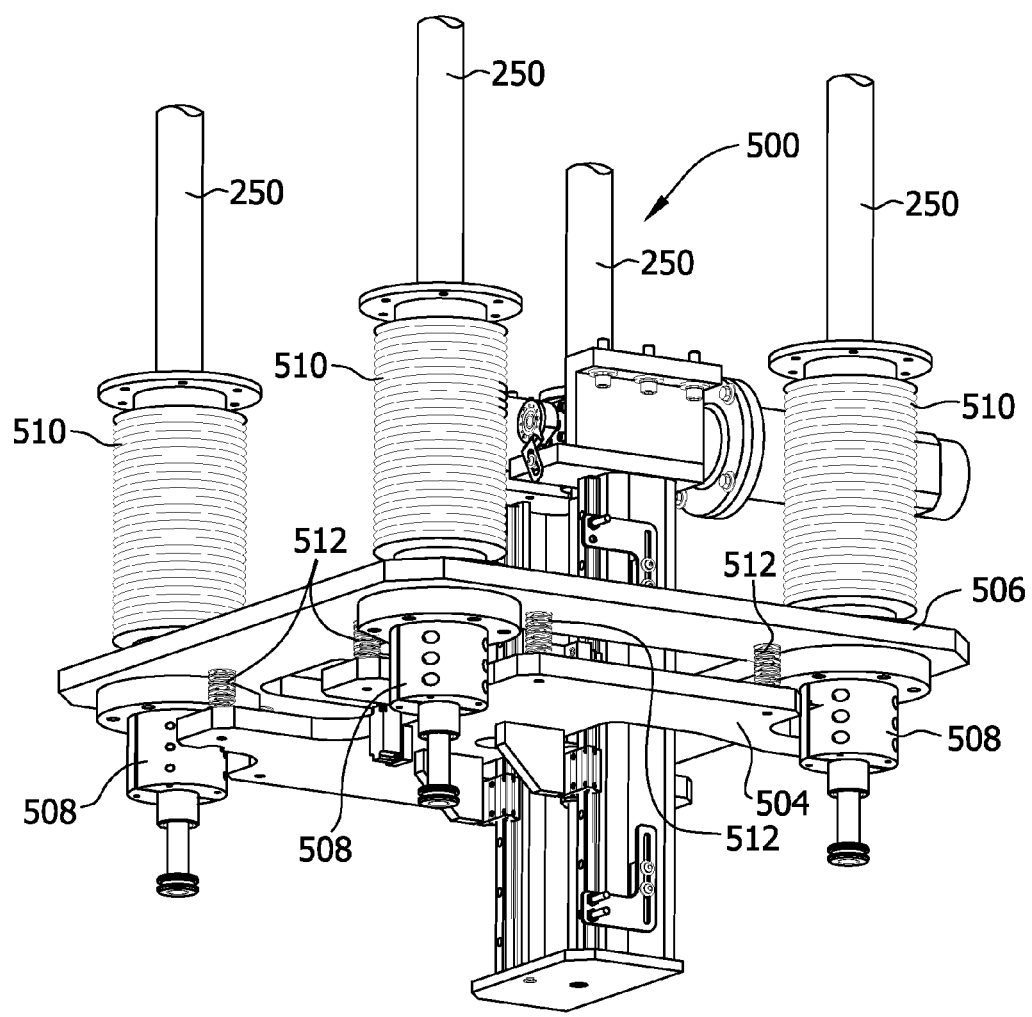
Figure 15:
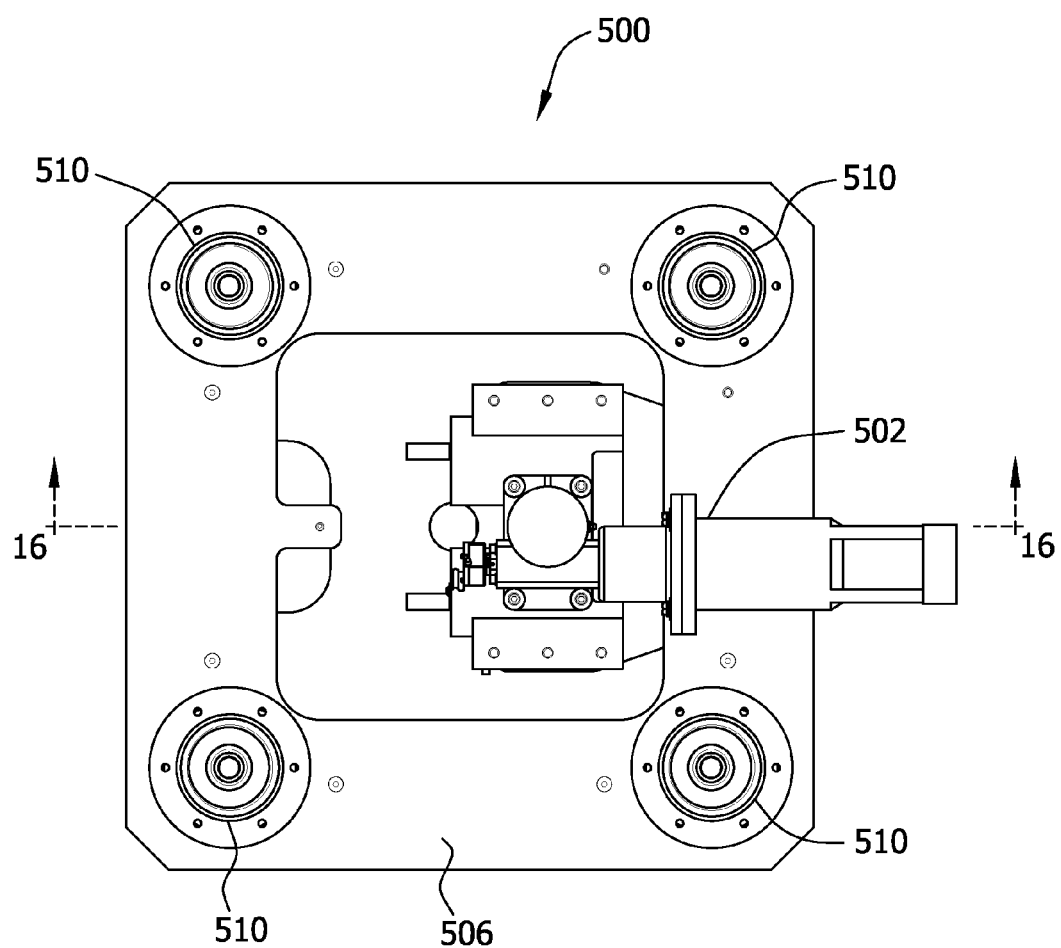
Figure 16:
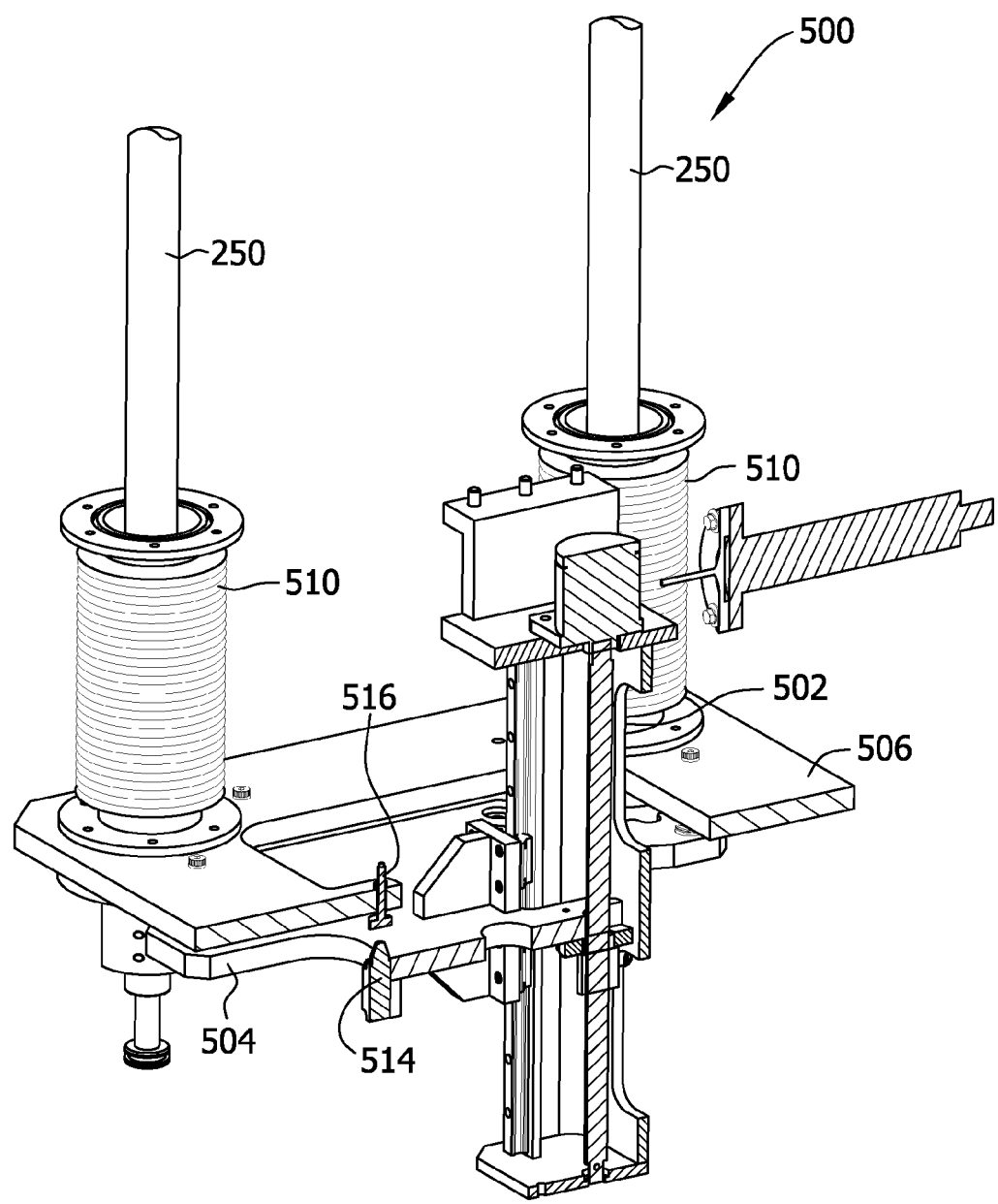

Helical compression springs 512 are disposed between the lower plate 504 and the upper plate 506, as shown in FIG. 14. Eight springs 512 are used in the example embodiment, although the number of springs may be altered without departing from the scope of the embodiments. In one embodiment, a thumb screw 516 (FIG. 16), a plunger 514, the springs 512, and a control system 550 (FIGS. 1 and 8) are used to control the amount of force exerted by the lift system against heat exchangers 200. The control system 550 can also be referred to as a force determination system in some embodiments.

The control system 550 is operable to receive communication from the plunger 514 (i.e., the two are communicatively coupled) when the plunger contacts the thumb screw 516 indicating as such. The plunger 514 and thumb screw 516 are referred to together as a limit switch. After the heat exchangers 200 have contacted the bottom of the crucible support 103, additional upward movement of the heat exchangers 200 by the lift system 500 causes compression of the springs 512. The control system 550 stops the lift system 500 from further raising the heat exchangers 200 when the plunger 514 communicates to the controller that the plunger has contacted the thumb screw 516.

The distance between the plunger 514 and the thumb screw 516 (i.e., a set distance) may be adjusted in this embodiment by rotating the thumb screw 516 with respect to the upper plate 506. A nut (not shown) may be used to prevent the thumb screw 516 from being further rotated once it is in a desired position. To increase the amount of force exerted by the lift system 500 against the heat exchangers 200, the distance between the plunger 514 and the thumb screw 516 is increased such that lift system compresses the springs 512 to a greater degree. Conversely, the distance between the plunger 514 and the thumb screw 516 is decreased to reduce the amount of force exerted by the lift system 500 against the heat exchangers 200.

Moreover the amount of force exerted by the lift system 500 against the heat exchangers can be calculated based on the displacement (i.e., compression) of the springs 512 and the spring constant k of the springs. In the example embodiment, this displacement is comprised of at least two components. The first is the distance between the plunger 514 and the thumbscrew 516 when the lift system 500 is in the first position as the springs 512 are displaced by this distance when the lift system 500 is in the second position. The second component is a preload compression caused when the lower plate 504 and the upper plate 506 are assembled together with fasteners. During this assembly, the springs 512 are compressed to some degree and this displacement can be measured.

The amount of force exerted by the actuator 502 on the heat exchangers 200 (and hence the force applied by the heat exchangers on the bottom 114 of the crucible support 103) is then defined by $F=k*y$, where y is the displacement of the springs 512. As multiple springs 512 are used in the lift system 500, the total force exerted by the lift system 500 against the heat exchangers 200 is determined by applying this equation to each of the springs. In the example embodiment where eight springs 512 are used and each have the same spring constant k and is displaced by the same amount, the force is defined by $F=8*k*y$. The above-described equation assumes that the springs 512 are linear springs. In embodiments using different types of springs (e.g., those which are not linear), the force may be calculated according to other suitable methods and/or equations.

In another embodiment, the plunger 514 or another suitable distance measuring device is used by the control system 550 to measure the distance between the plates 504, 506, and a thumb screw is unnecessary. The measured distance and the displacement resultant from the preload compression of the springs 512 represent the total compression y of the springs. Alternatively, other suitable devices may be used to measure the compression of the springs 512 without departing from the scope of the disclosure. As described above, the amount of force exerted by the actuator 502 on the heat exchangers 200 (and hence the force applied by the heat exchangers on the bottom 114 of the crucible support 103) is thus defined by $F=k*y$.

The control system 550 in this embodiment is thus operable to adjust the amount of force exerted by the actuator 502 by changing the position of the heat exchangers 200 with the actuator. That is, the control system 550 is operable to receive an input (from a user or another computing system) of a desired amount of force to be exerted by the actuator 502 against the bottom of the crucible support 103. The control system 550 can then monitor the exerted force and control the actuator 502 (and thus the position of the heat exchangers 200) such that the exerted force is equal to the desired amount of force or within a predetermined range of the desired amount (e.g., +/−5%).

Moreover, the control system 550 may also calculate the force exerted by the actuator 502 with one or more strain gauges and/or load cells. These strain gauges and/or load cells can be positioned between the bottom 114 of the crucible support 103 and the support posts 115 (FIGS. 6 and 7) such that as the heat exchangers 200 apply force to the crucible support, the force exerted on the strain gauges and/or load cells decreases. Other embodiments may calculate the force by measuring the current draw of the actuator 502, as the amount of current drawn by the actuator 502 increases as the amount of force exerted by the actuator increases. This increase in current draw correlates with the increase in force applied by the actuator 502 and lift system 500 against the heat exchangers 200.

In the example embodiment, the force applied by the actuator 502 is about 800 lbs., although other embodiments may use different magnitudes of force without departing from the scope of the embodiments. The force applied by the heat exchangers 200 against the crucible support 103 ensures that substantially the entire outer surface 204 of the plate 202 of the heat exchangers is in contact with the crucible support 103. This force also ensures that the outer surface 204 and/or the crucible support may deform slightly such that their surfaces are in contact. This contact between the crucible support 103 and the outer surface 204 increases the efficiency of heat transfer from the crucible support to the heat exchangers 200. Moreover, the control system 550 may also be used to ensure that the actuator 502 does not exert a greater than specified force against the heat exchangers 200. Forces greater than this specified force may damage the heat exchangers 200 and/or the crucible support 103 and/or lift the crucible support off of its support posts 115. In the example embodiment, this specified force may be greater than about 3000 lbs and/or the mass of the crucible support 103, crucible 102, and the charge contained in the crucible.

In operation, the containment vessel 110 is opened and the crucible 102 is charged with pieces of poly-crystalline silicon (e.g., chunks, granules, dust, etc.). The lid 112 of the crucible 102 (assuming a lid is used) and the containment vessel 110 are then closed and the heaters 108 are used to melt the silicon. While the silicon is being melted, the doors 300 in the side insulation 109 are in the closed position and the lower insulating members 400 are in the first position where they are disposed beneath the bottom 114 of the crucible support 103. Moreover, the heat exchangers 200 have been positioned in their first position by the lift system 500 such that they are spaced apart from the bottom 114 of the crucible support 103.

After the silicon has melted, the heaters 108 cease operation or their heat output is reduced and the silicon melt begins to solidify into an ingot. The doors 300 are moved to their second position and the lower insulating members 400 are also moved to their second position such that they are not disposed beneath the bottom 114 of the crucible support 103. Furthermore, the heat exchangers 200 are moved by the lift system 500 to its second position such that it is in contact with the bottom 114 of the crucible support 103. In some embodiments the heat exchangers 200 may not be moved to their second position and remain in their first position during solidification of the melt. In these embodiments, the insulating members 400 and/or the doors 300 may be positioned in any of their first, second, or intermediate positions during solidification of the melt.

The opening of the doors 300 and the movement of the lower insulating members 400 and the heat exchanger 200 aid in increasing the flow of heat away from the melt and solidification of the melt into the ingot. Moreover, the position of the doors 300 may be adjusted to an intermediate position to further control the rate at which heat is transferred away from the crucible 102 and the melt/ingot. In the example embodiment, the position of the doors 300 is adjusted by rotating the doors about their vertical axis to control this rate of heat transfer away from the melt/ingot. This control of the rate of the heat transfer permits the control of the rate of solidification of the melt. In some embodiments, a quartz rod is inserted into the melt to probe the melt to determine the location of solidification front.

Figure 17:
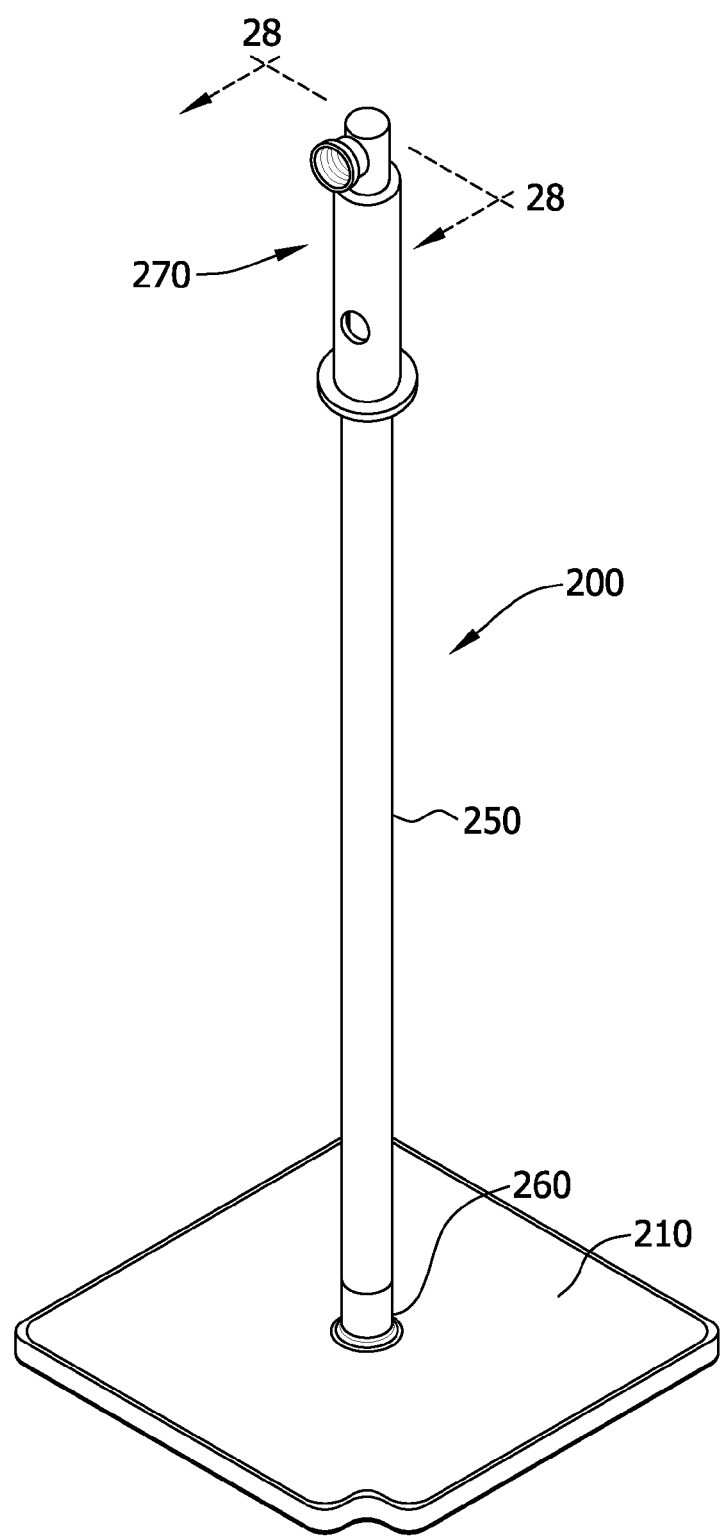
FIG. 17 is a perspective view of one of the heat exchangers of FIG. 1.
Figure 18:
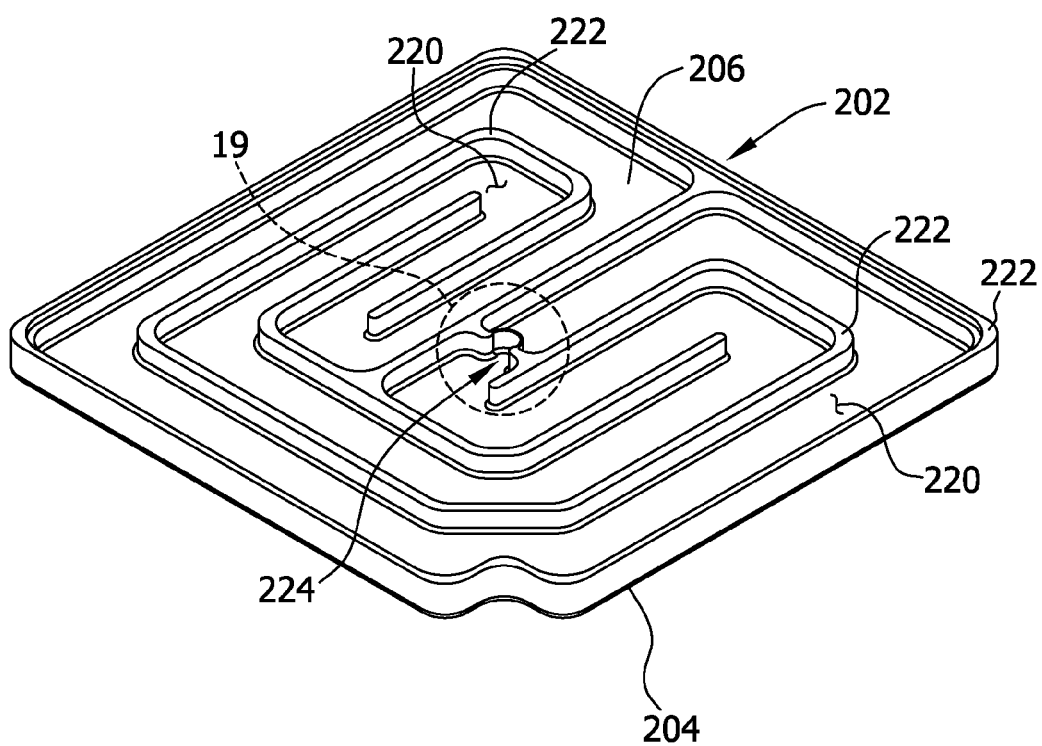
FIG. 18 is a perspective view of a plate used in the heat exchanger of FIG. 17.
Figure 19:
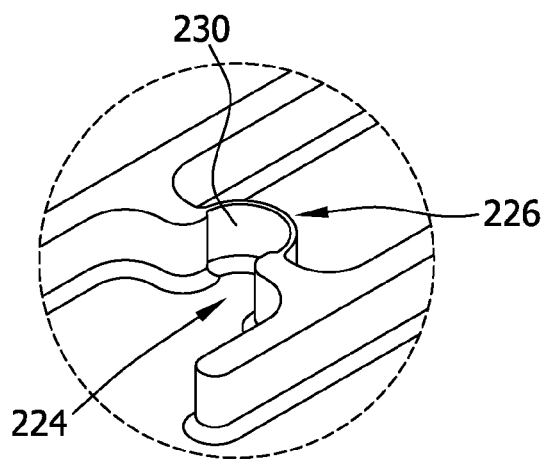
FIG. 19 is an enlarged portion of FIG. 18.
Figure 20:
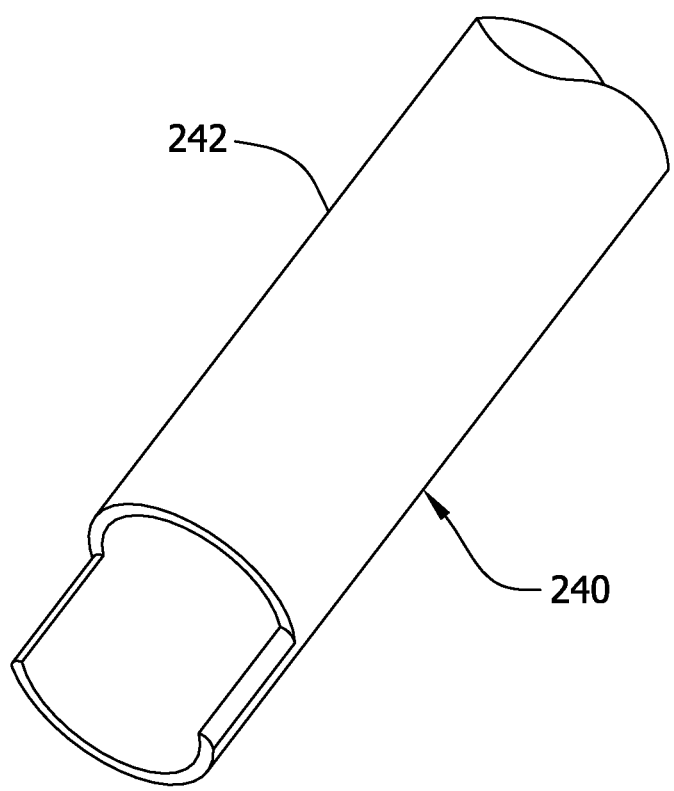
FIG. 20 is a perspective view of a portion of an inner conduit.
Figure 21:
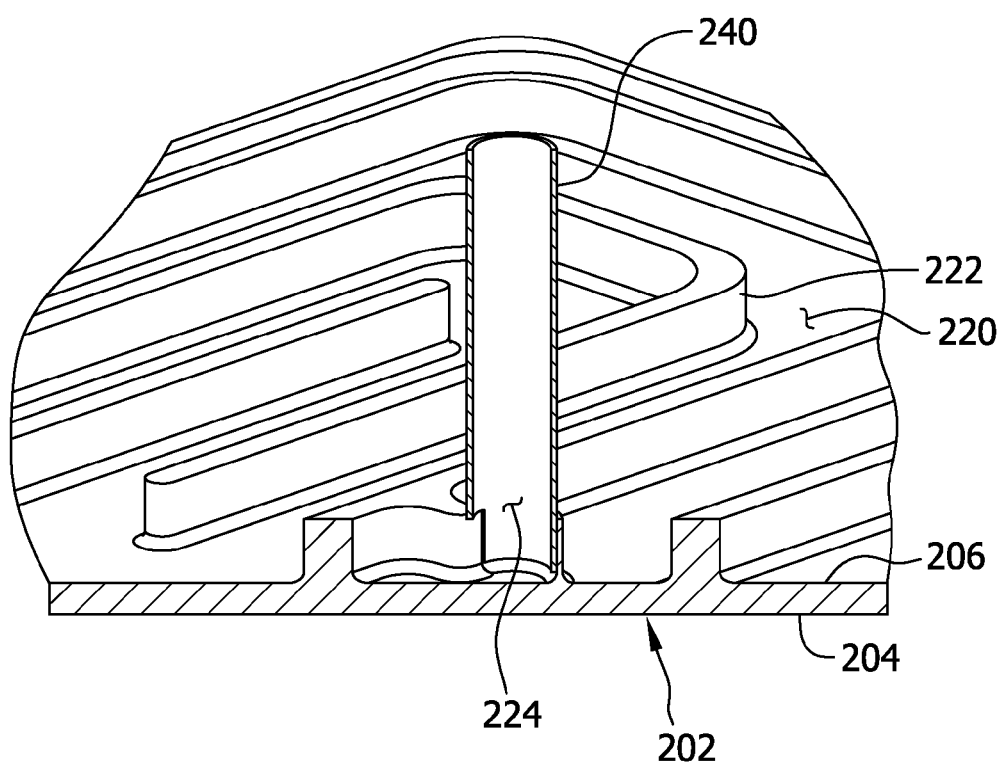
FIG. 21 is a cross-sectional view of the plate of FIG. 18 and the inner conduit of FIG. 20.
Figure 22:
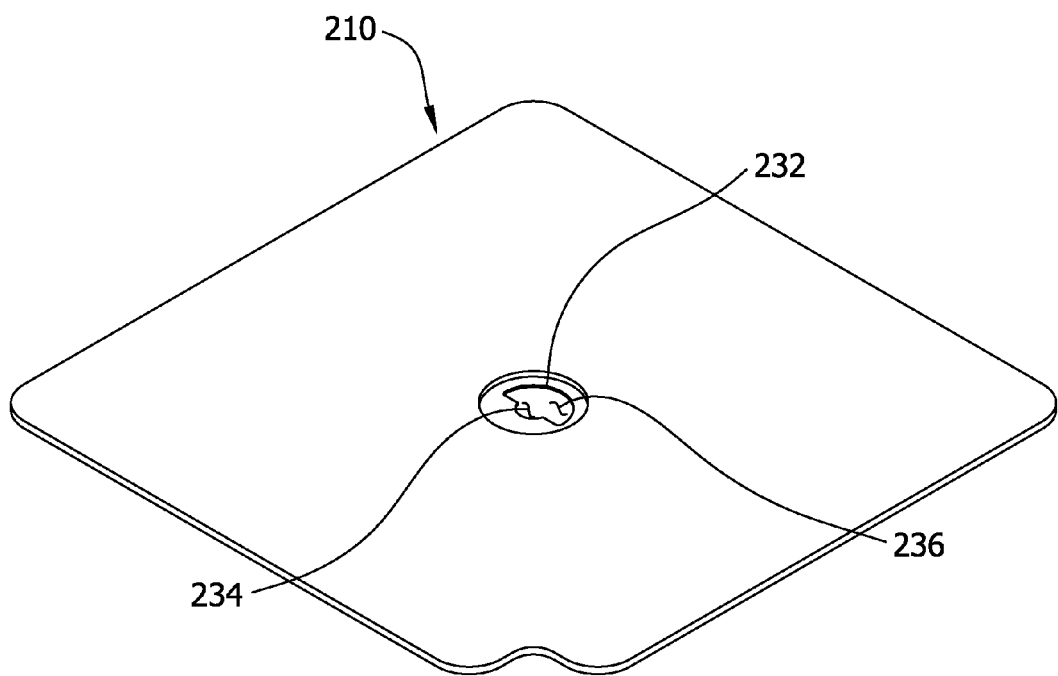
FIG. 22 is perspective view of a cover used in the heat exchanger of FIG. 17.
Figure 23:
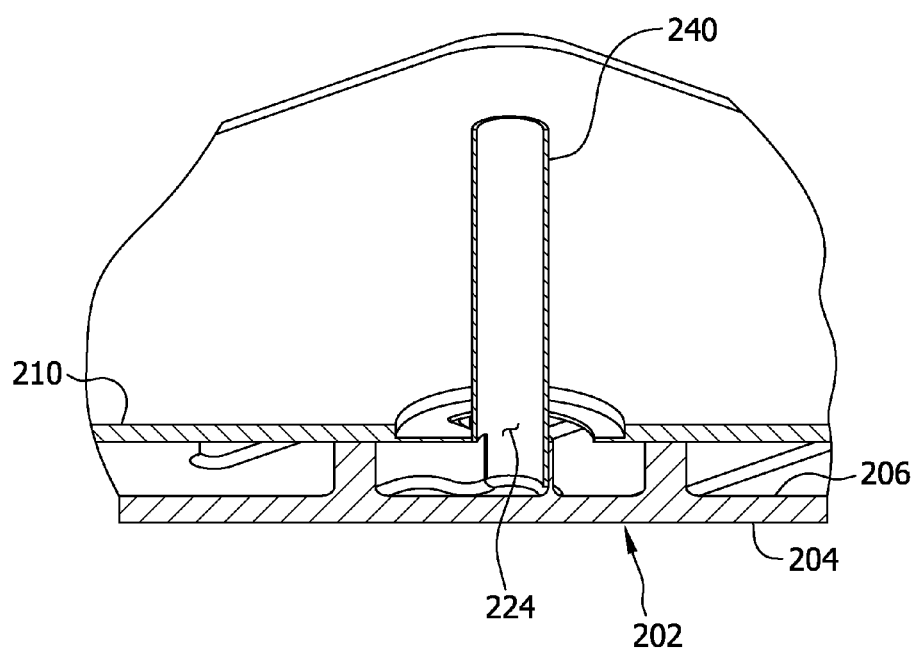
FIG. 23 is a cross-sectional view similar to the FIG. 21 with the cover of FIG. 22 positioned atop the plate.

One of the heat exchangers 200 is shown in greater detail in FIGS. 17-28 and is inverted from its position in FIG. 1 to better show its internal structure. As shown in FIG. 18, the heat exchanger 200 includes a plate 202 having an outer surface 204 for positioning proximate the lower surface 116 of the crucible 102. In the example embodiment, the outer surface 204 of the plate 202 is positioned adjacent the bottom 114 of the crucible support 103 and is substantially flat. The heat exchanger 200 is operable to transmit heat away from the lower surface 116 of the crucible 102 and silicon disposed in the crucible to a coolant. In other embodiments where the crucible support 103 is omitted, the outer surface 204 of the plate 202 is positioned adjacent the lower surface 116 of the crucible 102.

The plate 202 has an inner surface 206 opposite the outer surface 204. A cover 210 (FIGS. 17 and 22) is positioned proximate the inner surface 206 of the plate 202 and is connected to the plate with any suitable fastening system (e.g., welding).

As shown in FIG. 18, a circuitous flow path 220 is formed in the plate 202 for directing a flow of coolant along the inner surface 206 of the plate 202. The flow path 220 is defined by a channel including a plurality of members 222 extending from the inner surface 206 of the plate 202 to the cover 210 (the cover is omitted from FIG. 18). The flow path 220 defined by the members 222 is circuitous such that coolant flows along substantially all of the inner surface 206. The members 222 in the example embodiment extend generally perpendicularly from the inner surface 206 to the cover 210. The members 222 extend to adjacent the cover 210 and thus prevent the flow of coolant between the members and the cover. The members 222 thus do not allow coolant to "short-circuit" between adjacent portions of the flow path 220.

The flow path 220 has an inlet 224 for receiving a flow of fresh coolant and an outlet 226 through which coolant exits after it has flowed through the flow path. The inlet 224 and the outlet 226 are positioned adjacent each other. In some embodiments, the inlet 224 and the outlet 226 are coaxial with each other. A wall 230 (FIG. 19) extending from the inner surface 206 to the cover 210 separates the inlet 224 from the outlet 226. The wall 230 also aids in alignment of the other components of the heat exchanger 200. The inlet 224 and the outlet 226 are shown in the example embodiment as being positioned generally at or near a center of the plate 202. In other embodiments, the inlet 224 and the outlet 226 may be positioned differently (e.g., nearer a corner or a side of the plate 202).

The cover 210 (FIG. 22) has an opening 232 formed therein that is in fluid communication with the inlet 224 and the outlet 226 of the flow path 220. The opening 232 is positioned adjacent and/or coaxial both the inlet 224 and the outlet 226. The opening 232 has an inlet portion 234 and a larger outlet portion 236.

An inner conduit 240 (FIGS. 20, 21, and 23) is disposed within the inlet portion 234 of the opening 232 and is connected to the inlet 224 of the flow path 220. An outer conduit 250 (FIG. 28) is connected to the outlet 226 of the flow path 220, as discussed below in greater detail. The term conduit as used herein includes pipes, hoses, tubes, or other structures operable to convey a flow of liquid from one point to another. The inner conduit 240 is connected to the inlet 224 of the flow path 220 and the inner surface 206 of the plate 202 by welding in the example embodiment. In other embodiments, the inner conduit 240 may be connected by any suitable fastening system (e.g., welding or mechanical fasteners).

Figure 24:
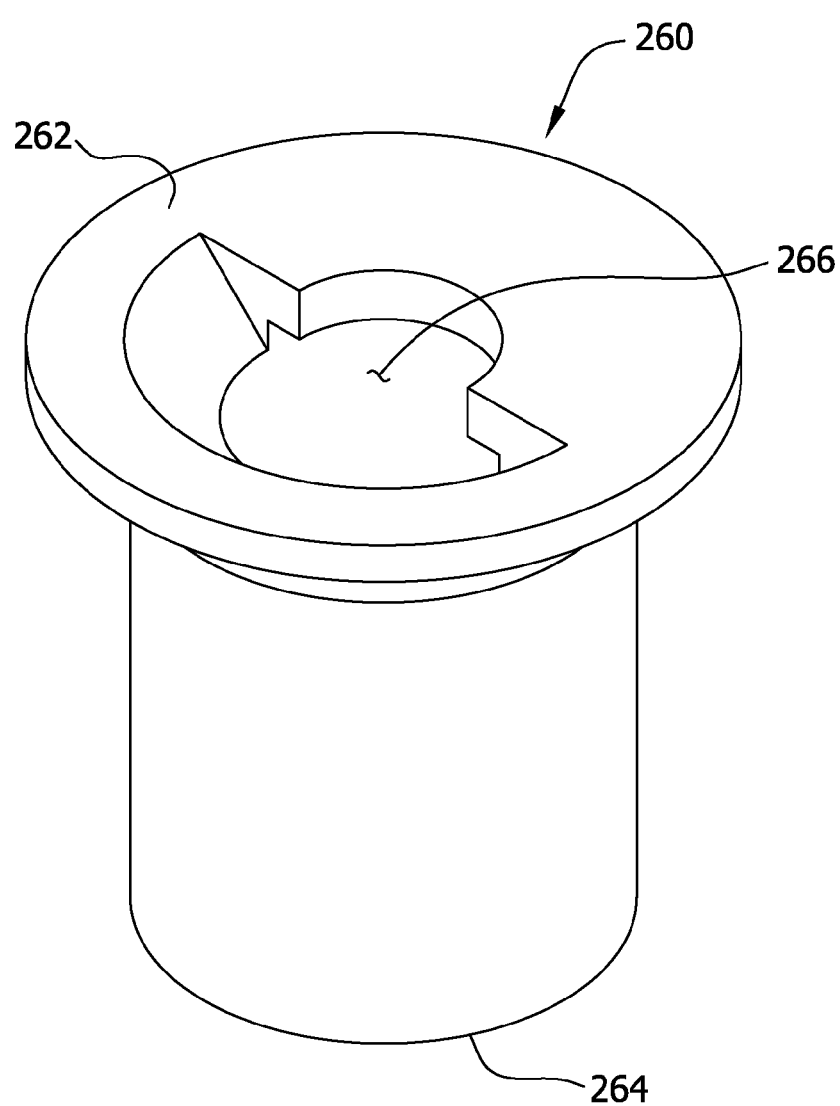
FIG. 24 is a perspective view of a connector.
Figure 25:
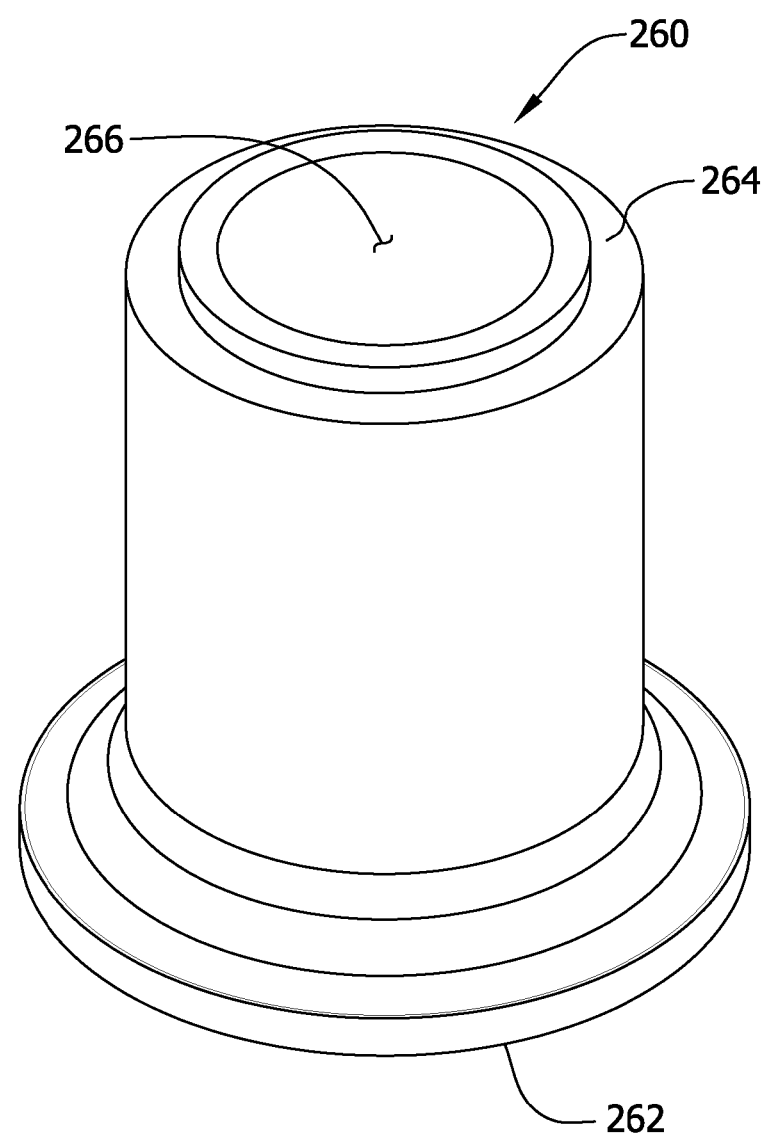
FIG. 25 is a perspective view of the connector of FIG. 24 in an inverted position.
Figure 26:
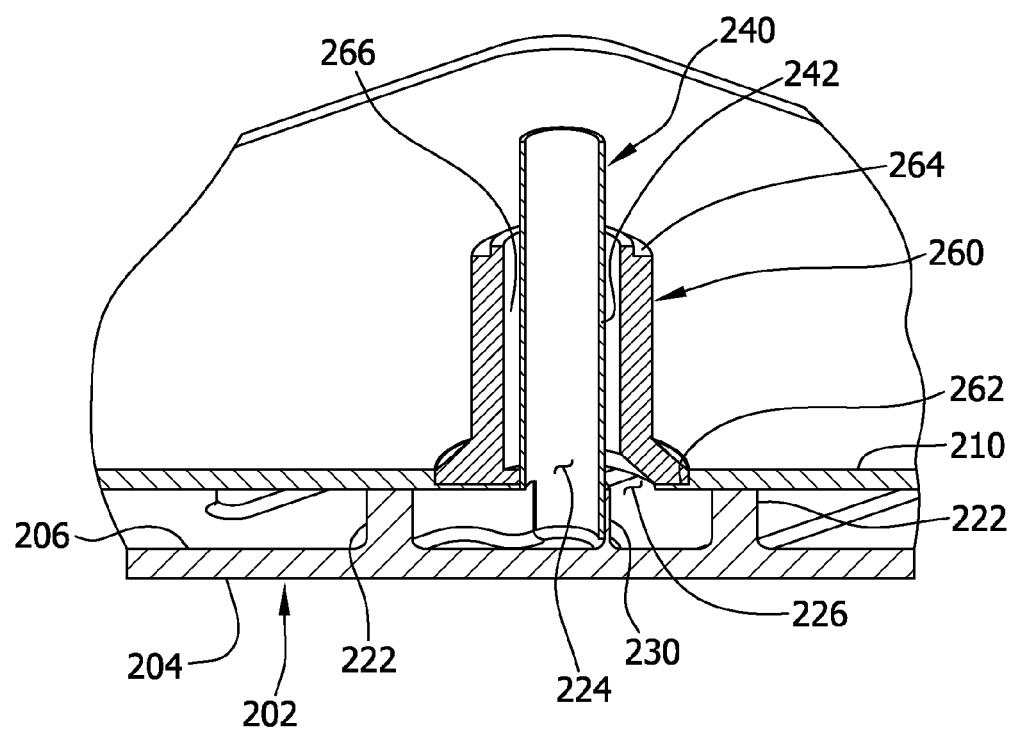
FIG. 26 is a cross-sectional view similar to FIG. 23 with the connector of FIGS. 24 and 25 connected to the conduit.
Figure 27:
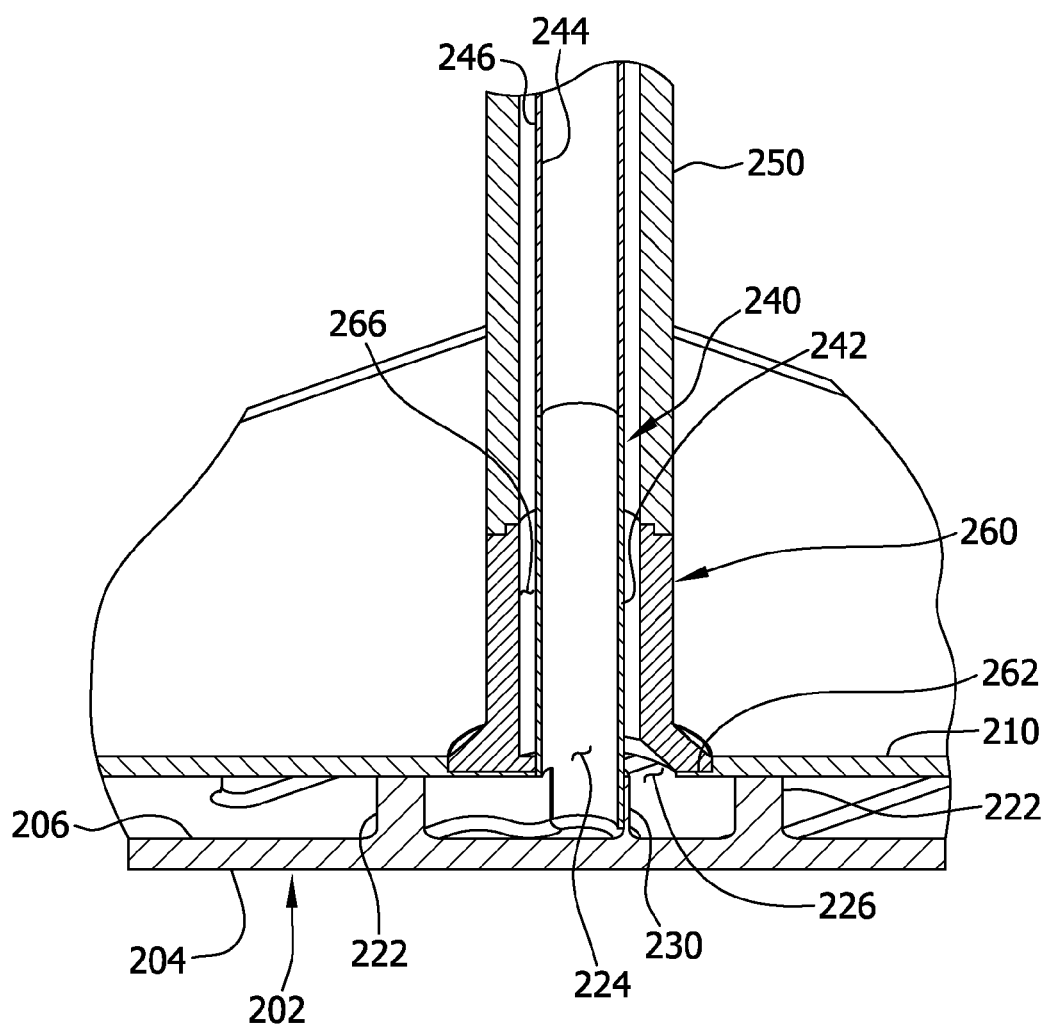
FIG. 27 is a cross-sectional view similar to FIG. 26 with an outer conduit connected to the connector.

The outer conduit 250 is connected to the outlet 226 of the flow path 220 by a connector 260 in the example embodiment. The connector 260, as shown in FIGS. 24 and 25, has an inlet section 262 for connection to the cover 210 and an outlet section 264 for connection to the outer conduit 250. The inlet section 262 of the connector 260 is connected to the cover 210 such that the inlet section is in fluid communication with the outlet 226 of the flow path 220. As shown in FIG. 26, a portion 242 of the inner conduit 240 is disposed within a central opening 266 of the connector 260. In other embodiments the connector 260 is omitted and instead the outer conduit 250 is connected directly to the cover 210 adjacent the outlet portion 236 of the opening 232 in the cover.

Figure 28:
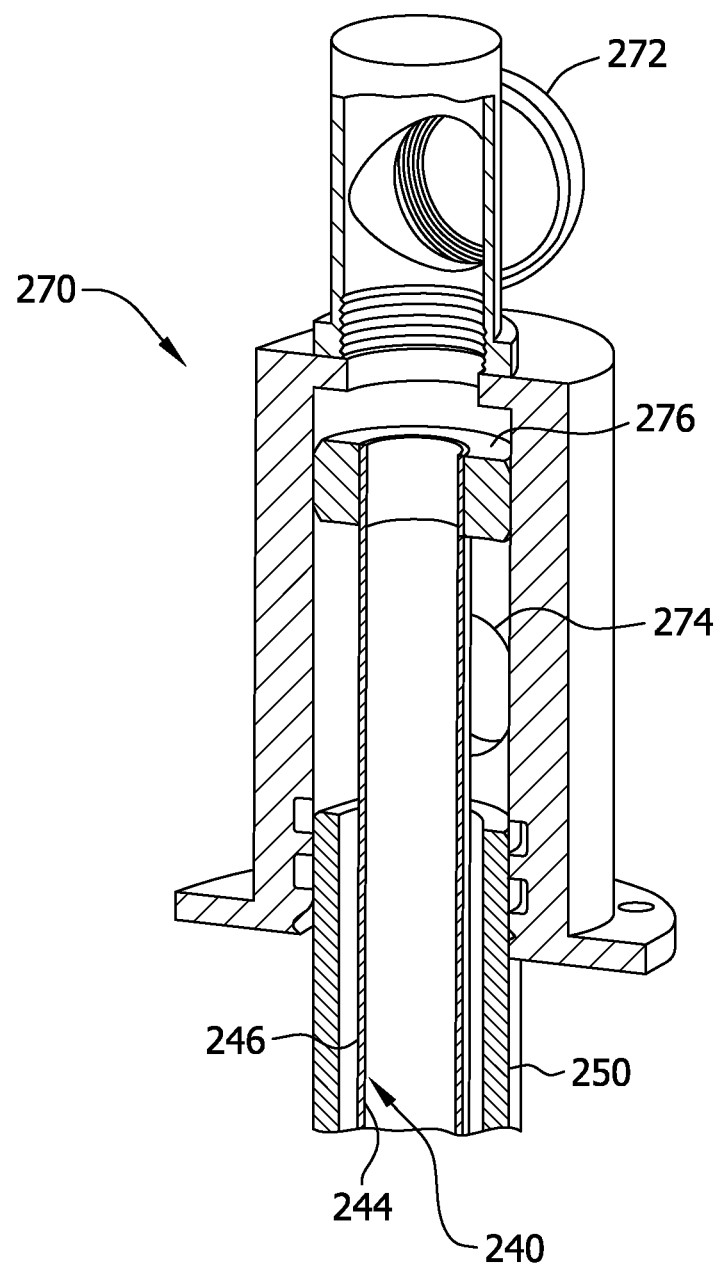
FIG. 28 is a cross-sectional view of the terminal connector of FIG. 17 taken along the 28-28 line.

As shown in FIG. 28, the outer conduit 250 is concentric with the inner conduit 240 and the inner conduit is disposed within the outer conduit. The outer conduit 250 and the inner conduit 240 thus form a multi-lumen conduit structure. In some embodiments, insulation (not shown) may be disposed adjacent the inner conduit 240 to reduce heat transfer from coolant in the outer conduit 250 to coolant in the inner conduit. This insulation can be disposed on either or both of an inner surface 244 or an outer surface 246 of the inner conduit 240. Moreover, all or a portion of the inner conduit 240 may be constructed from a material that has a lower thermal conductivity k compared to that of other components of the heat exchanger 200 to restrict the flow of heat through the inner conduit.

The conduits 240, 250 extend away from the cover 210 of the heat exchanger 200 and end at a terminal connector 270. The terminal connector 270 has an inlet port 272 in fluid communication with the inner conduit 240 and a corresponding outlet port 274 (best seen in FIG. 17) in fluid communication with the outer conduit 250. A gasket-like member 276 disposed within the terminal connector 270 prevents coolant from travelling between the inlet port 272 and the outlet port 274. The inlet port 272 is connected to the source tank 150 with the fluid communication system 170 (shown schematically in FIG. 1). Likewise, the outlet port 274 is connected to the receiving tank 160 with the fluid communication system 170.

In operation and as shown in FIGS. 1, 17, and 18, fresh coolant is supplied to the inlet port 272 of the terminal connector 270 from the source tank 150. The fresh coolant travels through the inner conduit 240 to the inlet 224 of the flow path 220 in the heat exchanger 200. The fresh coolant then flows through the flow path 220 and heat is transferred from the inner surface 206 of the plate 202 to the coolant. The heat is transferred to the inner surface 206 of the plate 202 from the silicon with the crucible 102. This heat transferred to the coolant causes the temperature of the coolant to increase. After flowing through the flow path 220, the coolant exits the flow path through the outlet 226. At this point, the coolant is referred to as spent coolant. The coolant flows through the outer conduit 250 to the terminal connector 270. The coolant then flows through the outlet port 274 of the terminal connector 270 to the receiving tank 160. The spent coolant may then be cooled by any suitable heat dissipation system that results in a reduction in the temperature of the coolant. The coolant may be transferred to the source tank 150 for subsequent reuse. Alternatively, the spent coolant may be disposed of after flowing from the outlet port 274 of the terminal connector 270.

In the embodiments described herein, fresh coolant is supplied to the inlet 224 of the flow path 220 through the inner conduit 240. In another reverse-flow embodiment, the flow of coolant through the flow path 220 may be reversed, such that fresh coolant is instead supplied to the outlet 226 of the flow path 220 from the outer conduit 250. The spent coolant then exits the flow path 220 though the inlet 224 and into the inner conduit 240. In this reverse-flow embodiment, the outlet port 274 of the terminal connector 270 is connected to the source tank 150 and the inlet port 272 is connected to the receiving tank 160.

The components of the heat exchanger 200 are constructed from suitable materials that are resistant to corrosion. In the example embodiments, such materials include steel, alloys thereof (e.g., stainless steel), aluminum-bronze compounds, or synthetic materials (e.g., hydrocarbon-containing plastics) capable of withstanding elevated temperatures.

The heat exchangers 200 described herein have reduced complexity and increased efficiency compared to prior heat exchangers. As described above, the inner and outer conduits 240, 250 are in a multi-lumen configuration. In prior systems, separate, non-concentric conduits are used to supply and return coolant from heat exchangers. Moreover, such prior systems do not have a flow path with an inlet adjacent to an outlet. Instead, the inlet and the outlet are spaced-apart, resulting in a more complex and larger arrangement occupying more space. This larger arrangement may be even more problematic in the system described above that use four heat exchangers.

Furthermore, the use of prior systems having separate, non-concentric conduits results in the creation of bending moments at the junction of the conduits with the heat exchanger. Such bending moments cause significant stress at the junction that can eventually result in the formation of cracks at the junction due to fatigue. The arrangement of the inner and outer conduits 240, 250 and the connector 260 of the heat exchanger 200 strengthen and stiffen the junction of the conduits and the heat exchanger. Accordingly, the junction is able to withstand greater stresses and is significantly less likely to crack.

The furnace 100 and associated components described above permit the casting of an ingot having a mass of greater than about 1000 kg, greater than about 1200 kg, or greater than about 1600 kg. This ingot is also substantially free of other defects (such as dislocations). Defects can limit the efficiency of wafers formed from the ingots, and thereby negatively effect the photovoltaic devices formed using the wafers. The most prevalent types of intra-grain defect in these wafers (e.g., mc-Si wafers) are dislocations. The dislocations form clusters that initiate from grains of some orientations and may thereafter spread or fan out from the cluster. These dislocation clusters may be sites for the precipitation of impurities, which lower the efficiency of photovoltaic devices formed from the wafers. The presence of dislocation clusters affects material properties and performance properties of the photovoltaic devices. These dislocations are generated from thermal stresses in the melt and ingot during solidification of the ingot and growth of the crystal.

Figure 29:
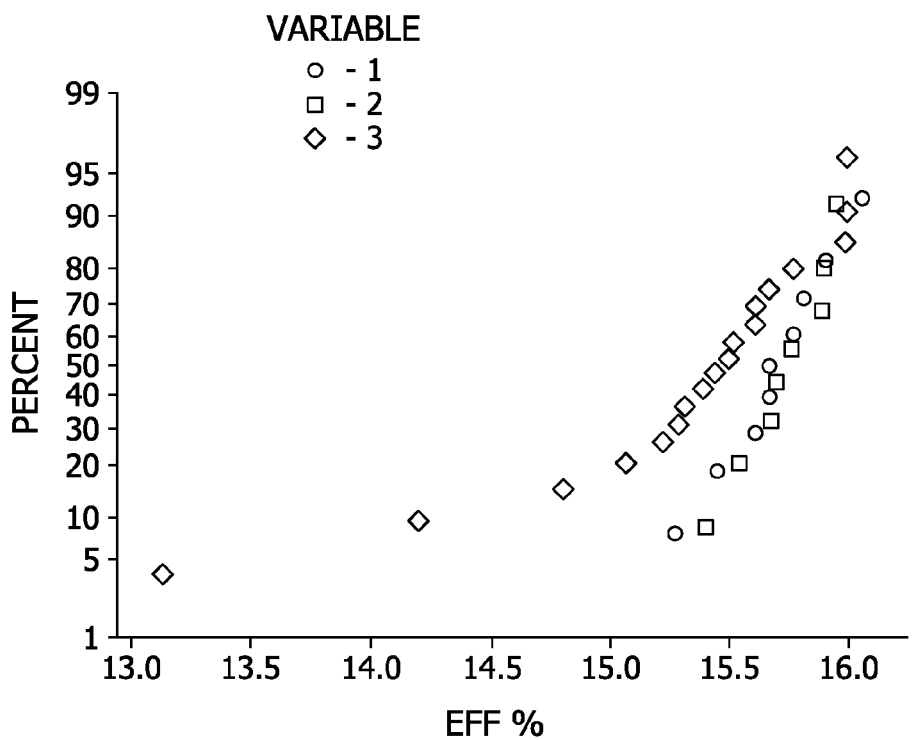
FIG. 29 is a graph depicting the efficiency of photovoltaic devices made from ingots manufactured in different furnaces.
Figure 30:
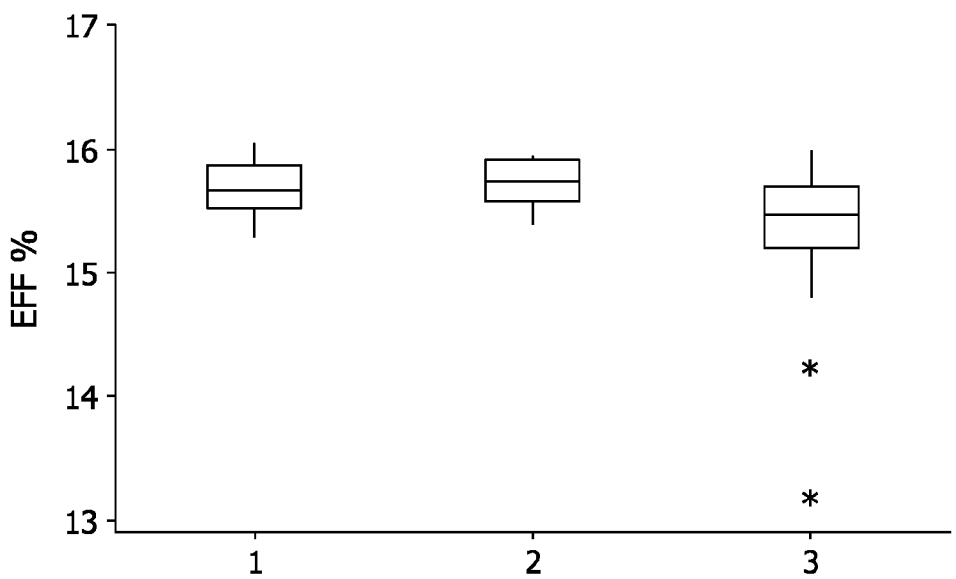
FIG. 30 is a box plot depicting the efficiency of photovoltaic devices made from ingots manufactured in different furnaces.
Figure 31:
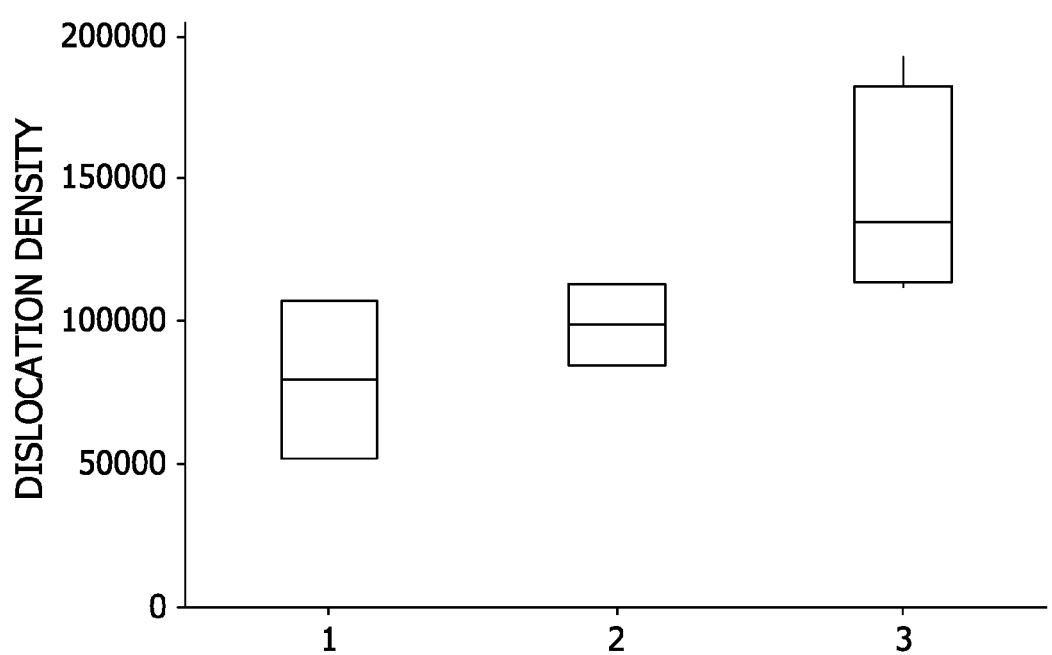
FIG. 31 is a box plot comparing the density of dislocations in ingots manufactured in different furnaces.

The furnace 100 and the associated components described above enable control of the thermal and growth profiles of the melt and ingot to minimize the thermal stresses imposed on the melt and ingot. This minimization of thermal stresses in the melt and ingot minimizes the formation of dislocations and increases the efficiency of wafers formed from the ingots which are used in photovoltaic devices or applications. FIGS. 29 and 30 depict the efficiency of photovoltaic devices formed from ingots made with different furnaces. Data sets 1 and 2 depict efficiencies of devices made from ingots manufactured in the furnace 100, while data set 3 depicts efficiencies of devices made in prior furnaces. FIG. 29 represents the efficiency data as a probability plot, while FIG. 30 represents the data as box plot. As clearly shown in these Figures, photovoltaic devices formed from ingots manufactured in the furnace 100 have greater efficiencies than those manufactured in prior furnaces. Furthermore, FIG. 31 is a box plot comparing the density of dislocations in ingots of the three data sets in units of counts per square centimeter. Data sets 1 and 2 clearly have a significantly lower dislocation density than that of ingots manufactured in prior furnaces. Moreover, the dislocation density of data sets 1 and 2 is less than about 100,000 counts per square centimeter, while the dislocation density of data set 3 is greater than about 110,000 counts per square centimeter. Note that in some embodiments, the dislocation density of ingots manufactured in furnaces embodying this disclosure may be less than 95,000 counts per square centimeter, or less than 90,000 counts per square centimeter, or even less than 80,000 counts per square centimeter.

In some aspects of the disclosure, the ingot has a length and a width such that that the ingot is cut into pieces to form smaller bricks the resulting bricks each have a standard size. This standard size is substantially similar to that of bricks cut from ingots formed in standard furnaces. In the example embodiment, the ingot has a length and a width of about 1375 mm and a height of about 400 mm. This ingot may then be cut into 64 smaller bricks having equal length and width, e.g., of about 156 mm. In some embodiments, the ingot may first be cut into four smaller ingots before being cut into the eight smaller ingots with a length and width of about 156 mm. In other embodiments, the ingot may be cut into 36 smaller bricks having a length and a width of about 210 mm. In still other embodiments, the height of the ingot may be up to or greater than about 800 mm.

The furnace 100 and associated components described herein permit the rate of cooling of the silicon melt to be precisely controlled. Control of the rate of cooling of the silicon melt allows for the precise control of the rate of solidification of the melt. This precise control of the solidification rate results in the formation of a directional solidification front in the ingot. By controlling the solidification rate, this position and shape of the solidification front can be manipulated and/or controlled such that it progresses vertically upwards away from the heat exchangers 200 positioned beneath the furnace. Moreover, the systems described herein also permit the creation of a substantially horizontal solidification front with the silicon melt. Accordingly, substantially all locations within a given horizontal plane in the melt solidify at about the same point in time.

Moreover, in some embodiments the shape of the solidification front may be controlled such it curves slightly down at its edges when solidification nears completion. This downward curve captures or concentrates impurities or dislocations near the edges of the ingot. Accordingly, lesser amounts of material may be removed from the ingot in order to remove the impurities. Furthermore, the controlled solidification of the melt into an ingot also permits the capture or concentration of impurities or defects in a specific portion of the ingot. In the example embodiment, this portion of the ingot is disposed farthest away from the heat exchangers and is the last portion of the ingot to solidify.

This precise control of the solidification rate permits ingots having a mass of greater than about 1000 kg to be formed in the furnace described above. The precise control of the solidification rate also increases the throughput of the furnace by reducing the amount of time required to cast an ingot in the furnace. Previous known systems lacked the features described above that permit the control of the rate of cooling of the silicon melt between low to high levels. In such prior systems, the rate of solidification thus could not be precisely controlled over such a range. As a consequence, attempts to cast ingots larger than about 600 kg resulted in the ingots having dislocations and/or defects that rendered the ingots and wafers formed from the ingots unfit for end-use applications (e.g., the manufacture of photovoltaic cells).

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A directional solidification furnace for producing a multi-crystalline silicon ingot, the furnace comprising:
    a crucible for containing a silicon charge;
    a crucible support disposed adjacent the crucible for supporting the crucible, the crucible support having a base;
    a cooling plate positioned beneath the base of the crucible support and including a heat exchanger;
    a lift system for moving the cooling plate between a first position where the cooling plate is free from contact with the base of the crucible support and a second position where the cooling plate is in contact with the base of the crucible support, the lift system moving the cooling plate in a vertical direction, the lift system comprising an upper plate spaced apart from a lower plate and at least one spring positioned between the upper plate and the lower plate, the upper plate and the lower plate positioned beneath the cooling plate; and
    a control system to control the amount of force exerted in the vertical direction by the cooling plate on the base of the crucible support,
    wherein the at least one spring has a spring constant indicative of the stiffness of the spring, the at least one spring being compressed when the cooling plate is in the second position,
    wherein the lift system comprises a limit switch, the limit switch is operable to determine if the lower plate is spaced less than a set distance from the upper plate.

2. The furnace of claim 1 wherein the lift system comprises a linear actuator.

3. The furnace of claim 1 wherein the limit switch is communicatively coupled to the control system such that the limit switch communicates to the control system when the lower plate is spaced less than the set distance from the upper plate.

4. The furnace of claim 1 wherein the lift system comprises a distance measuring device to measure the distance between the upper plate and the lower plate.

5. The furnace of claim 4 wherein the distance measuring device is a plunger.

6. The furnace of claim 4 wherein the control system is configured to determine the amount of force exerted by the cooling plate on the base of the crucible support based on the distance between the upper plate and the lower plate measured by the distance measuring device and the spring constant of the at least one spring.

7. The furnace of claim 1 further comprising a plurality of insulating members disposed beneath the base of the crucible support, the insulating members movable in a lateral direction between a first position where the insulating members restrict the flow of heat away from the crucible and a second position where the insulating members do not restrict the flow of heat away from the crucible,
wherein the cooling plate is in the first position when the insulating members are in their first position and the cooling plate is in the second position when the insulating members are in their second position.

8. The furnace of claim 1 further comprising a plurality of insulating members disposed adjacent the plurality of sides of the crucible, the insulating members movable between a first position where the insulating members restrict the flow of heat away from the crucible and a second position wherein the insulating do not appreciably restrict the flow of heat away from the sides of the crucible,
wherein the cooling plate is in the first position when the plurality of insulating members are in their first position and the cooling plate is in the second position when the insulating members are in their second position.

9. A system for raising and lowering one or more cooling plates in a directional solidification furnace for producing a multi-crystalline silicon ingot, the furnace including a crucible for containing a silicon charge and a support disposed adjacent the crucible, the system comprising:
one or more cooling plates positioned beneath a base of the support;
a lift system for moving the cooling plates between a first position where the cooling plates are free from contact with the base of the crucible support and a second position where the cooling plates are in contact with the base of the crucible support, the lift system moving the cooling plates in a vertical direction; and
a control system to control the amount of force exerted in the vertical direction by the cooling plates on the base of the crucible support, the lift system comprising a limit switch communicatively coupled to the control system such that the limit switch indicates to the control system when to cease vertical movement of the cooling plates, wherein the control system determines the amount of force exerted by the cooling plates on the base of the crucible support and adjusts the position of the cooling plates such that the amount of force is within a predetermined range,
wherein the lift system comprises an upper plate spaced apart from a lower plate and at least one spring positioned between the upper plate and the lower plate,
wherein the at least one spring has a spring constant indicative of the stiffness of the spring, the at least one spring being compressed when the cooling plate is in the second position,
wherein the limit switch is operable to determine if the lower plate is spaced less than a set distance from the upper plate.

10. The system of claim 9 wherein the limit switch communicates to the control system an indication when the lower plate is spaced less than the set distance from the upper plate.

11. The system of claim 9 wherein the lift system comprises a distance measuring device to measure the distance between the upper plate and lower plate.

12. The system of claim 11 wherein the control system is configured to determine the amount of force exerted by the cooling plates on the base of the crucible support based on the distance between the upper plate and the lower plate measured by the distance measuring device and the spring constant of the at least one spring.

13. The system of claim 9 wherein each of the cooling plates includes a heat exchanger.

14. The system of claim 13 wherein the upper plate and the lower plate are positioned beneath the cooling plates.

* * * * *